United States Patent
Endo et al.

(10) Patent No.: US 7,999,393 B2
(45) Date of Patent: Aug. 16, 2011

(54) SEMICONDUCTOR DEVICE AND MANUFACTURING METHOD THEREOF

(75) Inventors: Masato Endo, Ashigarakami-gun (JP); Tatsuya Kato, Yokkaichi (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 153 days.

(21) Appl. No.: 12/335,720

(22) Filed: Dec. 16, 2008

(65) Prior Publication Data

US 2009/0194879 A1 Aug. 6, 2009

(30) Foreign Application Priority Data

Feb. 1, 2008 (JP) ................... 2008-023254

(51) Int. Cl.
*H01L 23/48* (2006.01)
*H01L 23/52* (2006.01)
*H01L 29/40* (2006.01)

(52) U.S. Cl. ............... 257/775; 257/758; 257/E23.145; 257/E23.151

(58) Field of Classification Search .................. 257/758, 257/773–775, E23.145, E23.151
See application file for complete search history.

(56) References Cited

U.S. PATENT DOCUMENTS

| 4,322,821 | A | * | 3/1982 | Lohstroh et al. | ............ 365/155 |
| 2005/0122768 | A1 | * | 6/2005 | Fukumoto | ..................... 365/158 |
| 2005/0124103 | A1 | * | 6/2005 | Gil | ................. 438/197 |
| 2007/0003881 | A1 | | 1/2007 | Ito et al. | |
| 2011/0001243 | A1 | * | 1/2011 | Sel et al. | ....................... 257/773 |

FOREIGN PATENT DOCUMENTS

| JP | 6-181164 | 6/1994 |
| JP | 8-55920 | 2/1996 |
| JP | 2008-34789 | 2/2008 |

* cited by examiner

*Primary Examiner* — Matthew Smith
*Assistant Examiner* — Quovaunda Jefferson
(74) *Attorney, Agent, or Firm* — Oblon, Spivak, McClelland, Maier & Neustadt, L.L.P.

(57) ABSTRACT

A semiconductor device includes a plurality of first interconnection layers which are provided in an insulating layer and formed in a pattern having a width and space smaller than a resolution limit of an exposure technique, and a second interconnection layer which is provided between the first interconnection layers in the insulating layer and has a width larger than that of a first interconnection layer. A space between the second interconnection layer and each of first interconnection layers adjacent to both sides of the second interconnection layer equals the space between the first interconnection layers.

13 Claims, 34 Drawing Sheets

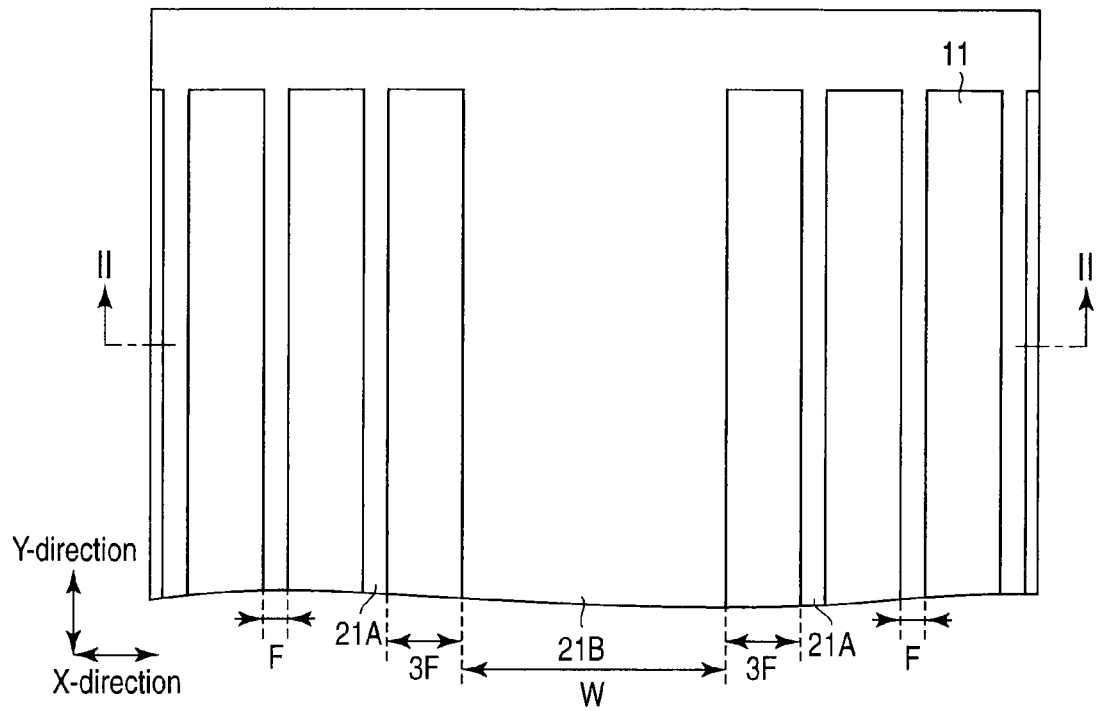
F I G. 5
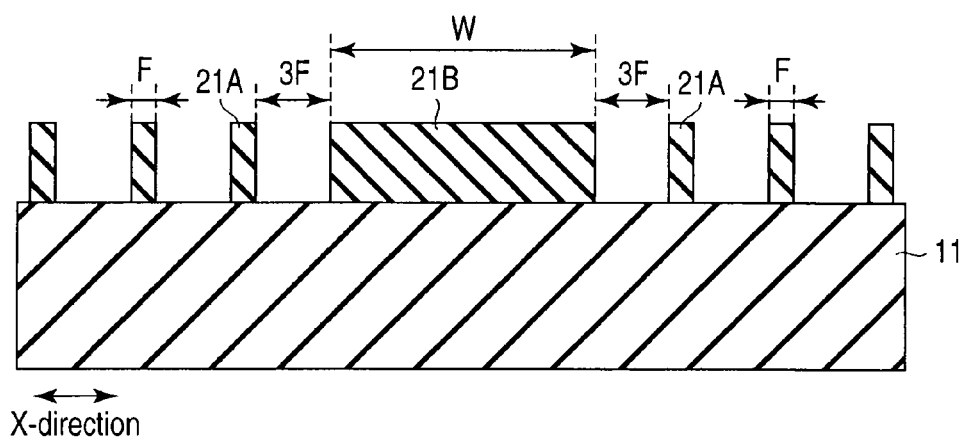
F I G. 6

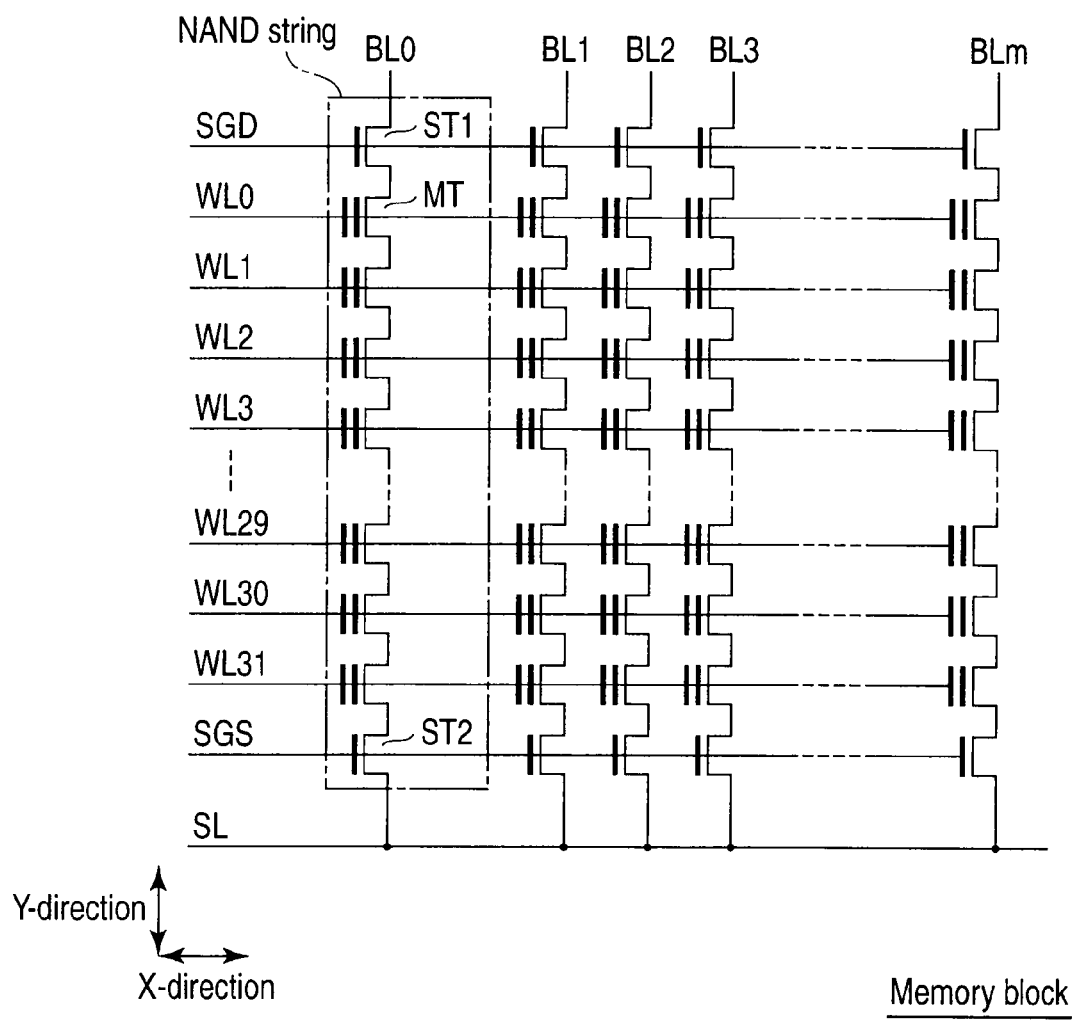
F I G. 3 3

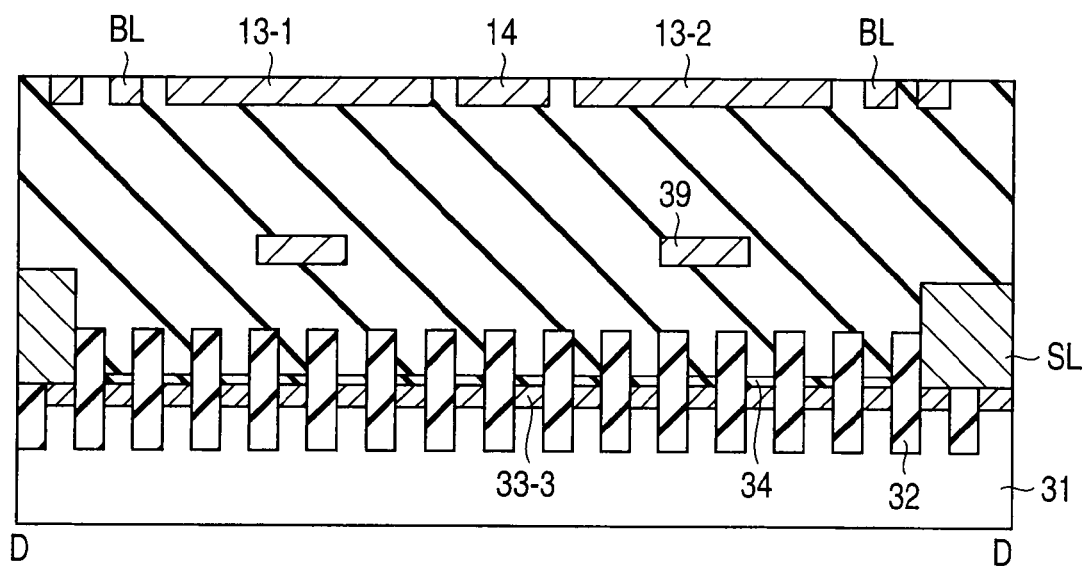
F I G. 3 9

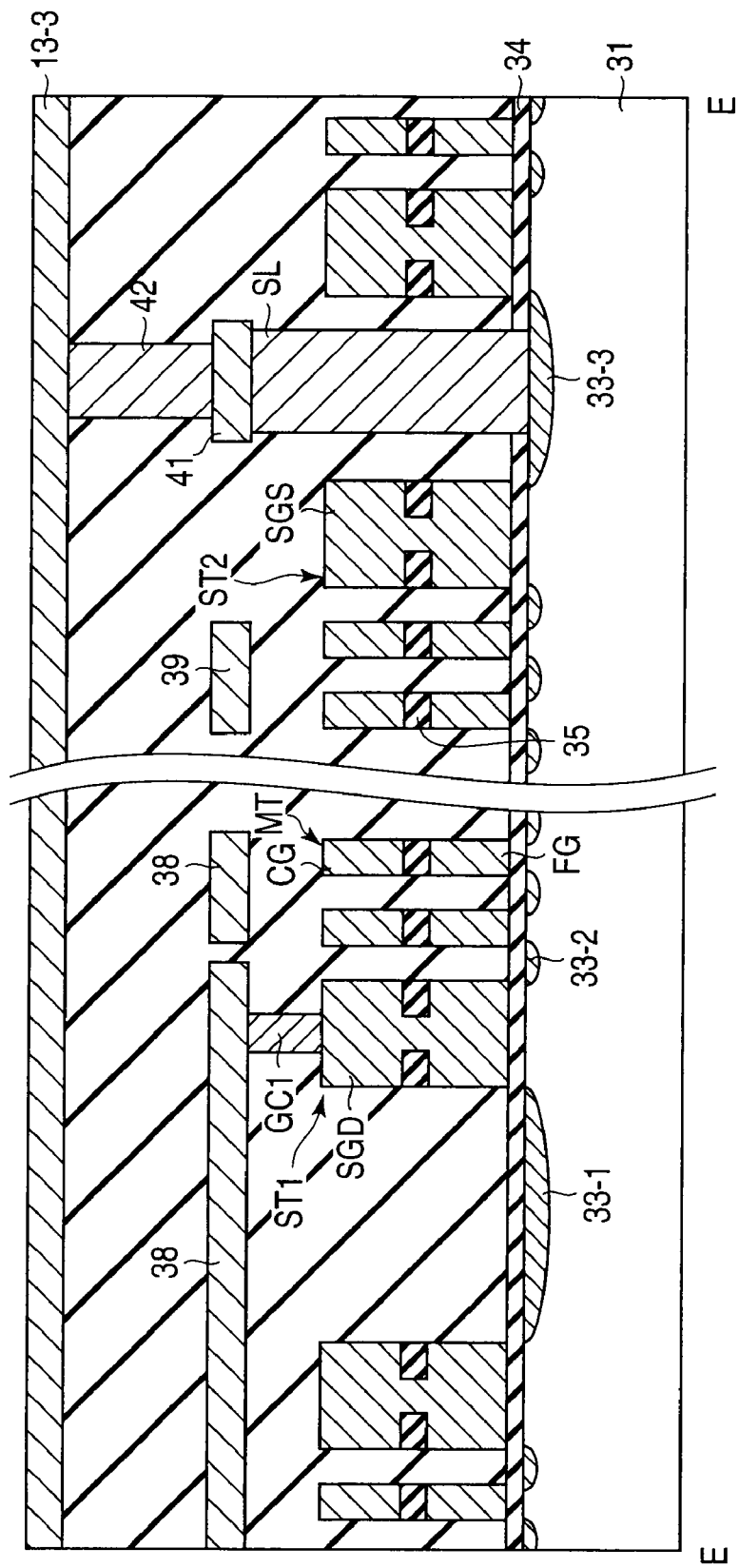
F I G. 41

SEMICONDUCTOR DEVICE AND MANUFACTURING METHOD THEREOF

CROSS-REFERENCE TO RELATED APPLICATIONS

This application is based upon and claims the benefit of priority from prior Japanese Patent Application No. 2008-023254, filed Feb. 1, 2008, the entire contents of which are incorporated herein by reference.

BACKGROUND OF THE INVENTION

1. Field of the Invention

The present invention relates to a semiconductor device and a manufacturing method thereof and, more particularly, to a semiconductor device having a plurality of interconnection layers with different widths and a manufacturing method thereof.

2. Description of the Related Art

To form a line-and-space interconnection pattern on a semiconductor substrate, for example, a method is known in which an interconnection pattern is buried in trenches formed in an insulating layer, thereby forming lines and spaces. In this method, a mask having the same pattern as a line-and-space interconnection pattern that is resolvable by an exposure technique is formed. Using this mask, an underlying layer formed from an insulating layer is patterned to form trenches. An interconnection material is buried in the trenches of the processed underlying layer. Then, the unnecessary interconnection material is removed by, e.g., chemical mechanical polishing (CMP), thereby obtaining a desired interconnection pattern.

In manufacturing a memory or the like, interconnections having a large width are sometimes formed in lines and spaces of the same pitch. To form narrow interconnections and wide interconnections in different lithography processes, it is necessary to ensure a large space between a narrow interconnection and a wide interconnection in consideration of the alignment margin. This makes it difficult to microfabricate a semiconductor device.

An associated technique of this type is also disclosed, which manufactures an LSI having a more sophisticated function by projecting and exposing an LSI pattern including a plurality of functional blocks onto a substrate via a lens using an optimum exposure method conforming to the characteristics of a pattern in a selected region (Jpn. Pat. Appln. KOKAI Publication No. 6-181164).

BRIEF SUMMARY OF THE INVENTION

According to an aspect of the present invention, there is provided a semiconductor device comprising: a plurality of first interconnection layers which are provided in an insulating layer and formed in a pattern having a width and space smaller than a resolution limit of an exposure technique; and a second interconnection layer which is provided between the first interconnection layers in the insulating layer and has a width larger than that of a first interconnection layer. A space between the second interconnection layer and each of first interconnection layers adjacent to both sides of the second interconnection layer equals the space between the first interconnection layers.

According to an aspect of the present invention, there is provided a semiconductor device comprising: a plurality of first interconnection layers which are provided in an insulating layer and formed in a pattern having a width and space smaller than a resolution limit of an exposure technique; two second interconnection layers each of which is provided between the first interconnection layers in the insulating layer and has a width larger than that of a first interconnection layer; and a third interconnection layer which is provided between the second interconnection layers in the insulating layer and has a width not less than that of the first interconnection layer. A space between each of the second interconnection layers and a first interconnection layer adjacent to the second interconnection layer equals the space between the first interconnection layers. A space between each of the second interconnection layers and the third interconnection layer equals the space between the first interconnection layers.

According to an aspect of the present invention, there is provided a semiconductor device manufacturing method comprising: forming, on an insulating layer, a plurality of first mask layers and a second mask layer which is arranged between the first mask layers and has a width larger than that of a first mask layer, the first mask layers and the second mask layer being arrayed at equal spaces; reducing a width of each of the first mask layers and the second mask layer by selectively etching the first mask layers and the second mask layer; forming a plurality of sidewalls on side surfaces of the first mask layers and the second mask layer; removing the first mask layers and the second mask layer to leave the sidewalls; selectively etching the insulating layer using the sidewalls as a mask to form, in the insulating layer, a plurality of first trenches and a second trench which is arranged between the first trenches and has a width larger than that of a first trench; and burying a conductor in the first trenches and the second trench to form, in the insulating layer, a plurality of first interconnection layers and a second interconnection layer having a width larger than that of a first interconnection layer.

BRIEF DESCRIPTION OF THE SEVERAL VIEWS OF THE DRAWING

FIG. 5 is a plan view showing a step in the manufacture of the semiconductor device following FIG. 3;

FIG. 6 is a sectional view showing a step in the manufacture of the semiconductor device taken along line II-II in FIG. 5;

FIG. 33 is a circuit diagram showing the arrangement of one memory block BLK included in a NAND flash memory according to the third embodiment of the present invention;

FIG. 39 is a sectional view of the NAND flash memory taken along line D-D in FIG. 35;

FIG. 41 is a sectional view of the NAND flash memory taken along line E-E in FIG. 40.

DETAILED DESCRIPTION OF THE INVENTION

Figure 1:
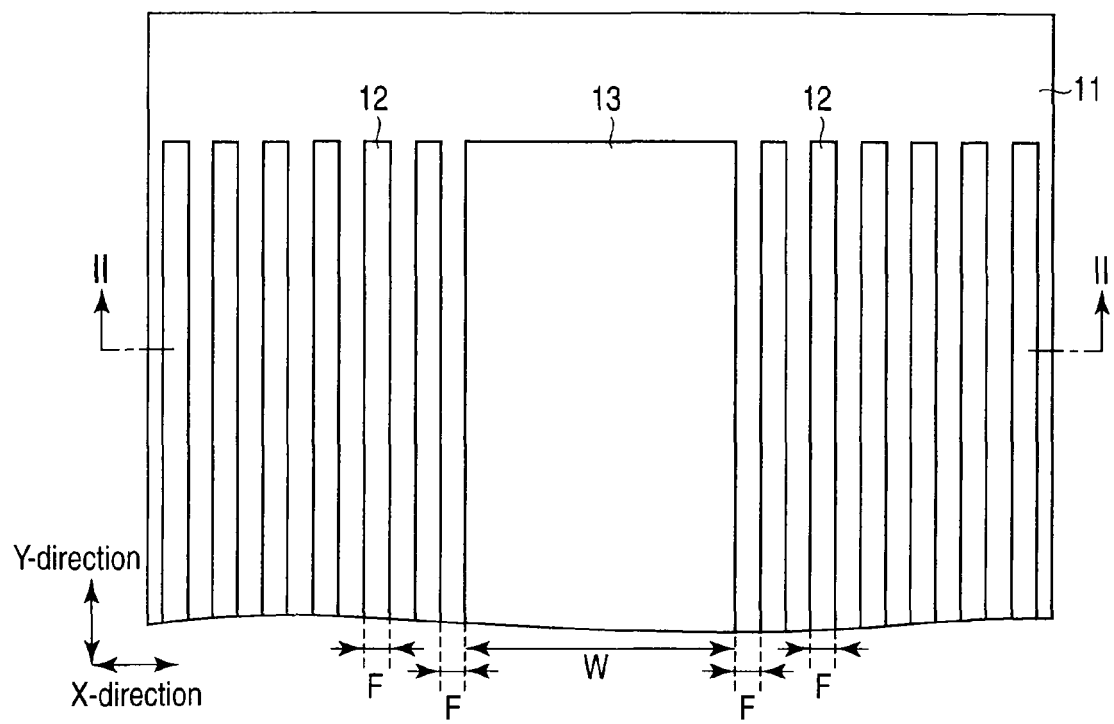
FIG. 1 is a plan view showing the arrangement of a semiconductor device according to the first embodiment of the present invention.

The embodiments of the present invention will now be described with reference to the accompanying drawing. Note that in the following explanation, the same reference numerals denote elements having the same functions and arrangements, and a repetitive explanation will be made only when necessary.

First Embodiment

Figure 2:
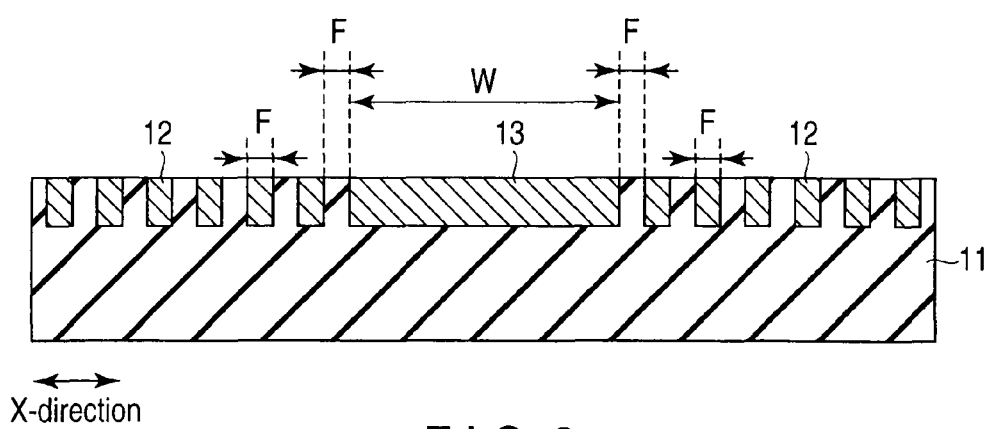
FIG. 2 is a sectional view of the semiconductor device taken along line II-II in FIG. 1.

FIG. 1 is a plan view showing the arrangement of a semiconductor device according to the first embodiment of the present invention. FIG. 2 is a sectional view of the semiconductor device taken along line II-II in FIG. 1.

A plurality of level layers are formed on a substrate (not shown). Each level layer includes an interlayer dielectric film and interconnection layers formed in it. FIGS. 1 and 2 show one of the plurality of level layers.

A plurality of interconnection layers running in the Y-direction are formed in an interlayer dielectric film 11. The plurality of interconnection layers formed in the interlayer dielectric film 11 include a plurality of first interconnection layers 12 having the same width, and a second interconnection layer 13 which is formed between the plurality of first interconnection layers 12 and has a width W larger than that of the first interconnection layer 12.

The resolution limit of the exposure technique, i.e., the minimum feature size is "2F". The width of each first interconnection layer 12 is set to be smaller than the minimum feature size "2F" and is almost equal to "F". The space between the plurality of first interconnection layers 12 in the X-direction perpendicular to the Y-direction is set to "F", like the width of each first interconnection layer 12. That is, the X-direction pitch of the pattern in the region where the plurality of first interconnection layers 12 are formed is set to "2F". The semiconductor device of this embodiment has a line-and-space pattern finer than the resolution limit of the exposure technique, as described above. Note that the "pitch" is the unit of repeat of an interconnection (line) and corresponds to the sum of the width of one line and the width of one space.

The space between a first interconnection layer 12 and the second interconnection layer 13 is set to "F". That is, in the semiconductor device of this embodiment, all the spaces between the interconnection layers are set to "F". This allows microfabrication in the X-direction. It is therefore possible to reduce the area of the semiconductor device including a plurality of interconnection layers with different widths.

The first interconnection layers 12 and the second interconnection layer 13 are made of, e.g., a simple substance of copper (Cu), aluminum (Al), or ruthenium (Ru), or mixed interconnections containing two or more kinds of materials. An example of the material of the interlayer dielectric film 11 is silicon oxide.

A method of manufacturing the semiconductor device according to the first embodiment will be described next with reference to the accompanying drawing. FIGS. 3, 5, 8, 10, 12, 13, and 15 are plan views for explaining steps in the manufacture. FIGS. 4, 6, 7, 9, 11, 14, and 16A are sectional views taken along line II-II in the plan views.

Figure 3:
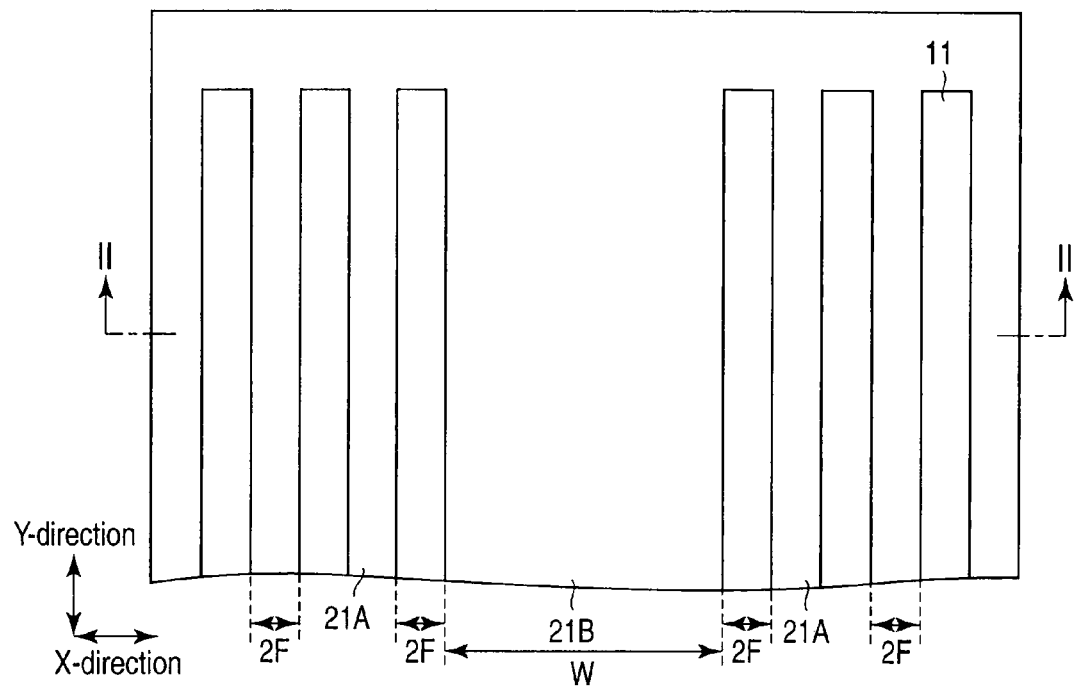
FIG. 3 is a plan view showing a step in the manufacture of the semiconductor device according to the first embodiment.
Figure 4:
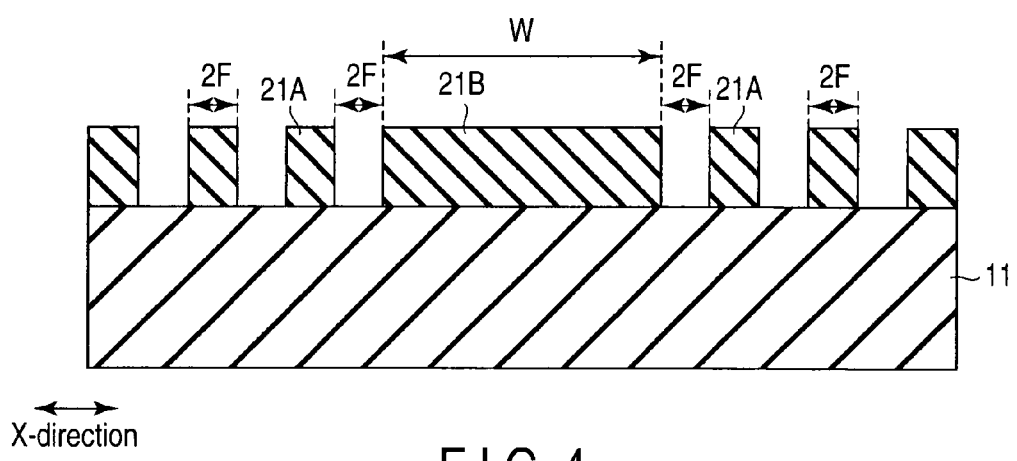
FIG. 4 is a sectional view showing a step in the manufacture of the semiconductor device taken along line II-II in FIG. 3.

As shown in FIGS. 3 and 4, a mask layer 21 having an etching selectivity with respect to the insulating layer 11 is deposited on the insulating layer 11 by, e.g., chemical vapor deposition (CVD).

The mask layer 21 is patterned by lithography and reactive ion etching (RIE) to form a plurality of mask layers 21A each of which has a width "2F" equal to the minimum feature size ascribable to the exposure technique and one mask layer 21B which has a width W larger than "2F" and is arranged between the mask layers 21A. The width W of the mask layer 21B is set to n (n is a natural number of 1 or more) times of the width "2F" of the mask layer 21A. The space between all mask layers in the X-direction is set to "2F". Hence, the X-direction pitch of the pattern in the region where the plurality of mask layers 21A are formed is set to "4F". When the width of the mask layer 21A is set to "2F", and the width of the mask layer 21B is set to a multiple of "2F", the pattern margin in lithography improves.

Next, as shown in FIGS. 5 and 6, a slimming process using, e.g., wet etching is performed to further microfabricate the mask layers 21A and 21B. With this process, the width of the mask layer 21A is set to "F", and the width W of the mask layer 21B is set to "2F×n−F". The space between all mask layers in the X-direction is set to "3F".

Figure 7:
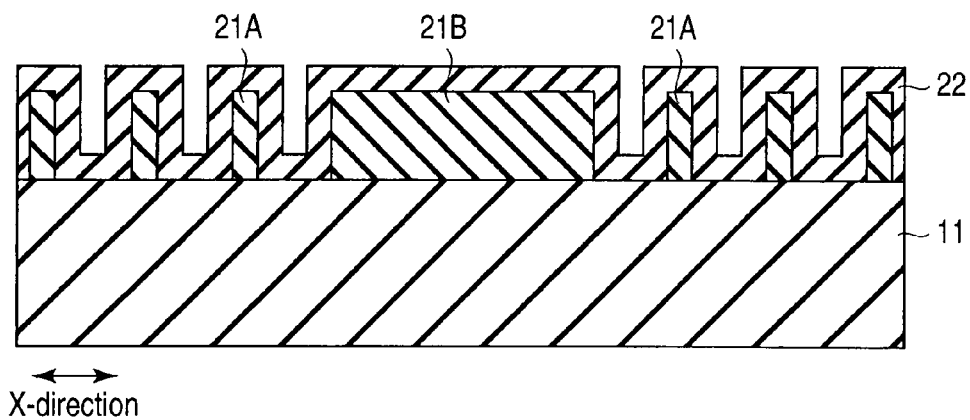
FIG. 7 is a sectional view showing a step in the manufacture of the semiconductor device following FIG. 6.

As shown in FIG. 7, an insulating layer 22 is deposited on the entire device by, e.g., CVD. The insulating layer 22 is made of a material having an etching selectivity with respect to the insulating layer 11 and the mask layer 21. An example of the combination of the insulating layer 22, insulating layer 11, and mask layer 21 is silicon oxide, silicon nitride, and amorphous silicon. The insulating layer 11 uses, e.g., silicon oxide having a low dielectric constant. The mask layer 21 and the insulating layer 22 use silicon nitride which is easy to remove by wet etching and amorphous silicon which has selectivity to silicon nitride and rarely poses a problem of contamination, respectively.

Figure 8:
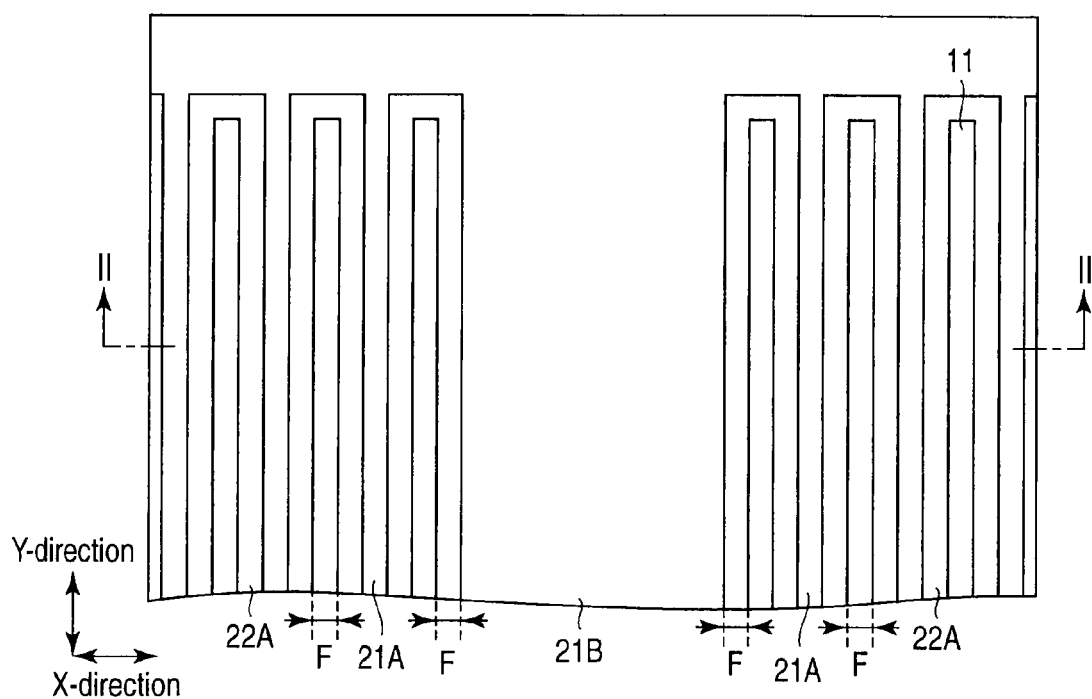
FIG. 8 is a plan view showing a step in the manufacture of the semiconductor device following FIG. 7.
Figure 9:
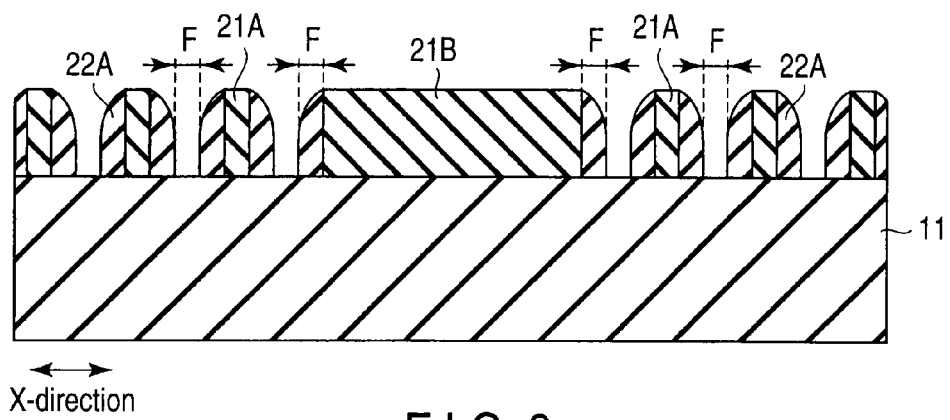
FIG. 9 is a sectional view showing a step in the manufacture of the semiconductor device taken along line II-II in FIG. 8.

As shown in FIGS. 8 and 9, the insulating layer 22 is selectively etched by, e.g., RIE to form a plurality of sidewalls 22A on the side surfaces of the mask layers 21A and 21B. The width of each sidewall 22A is set to "F". The space between the sidewalls 22A in the X-direction is set to "F".

Figure 10:
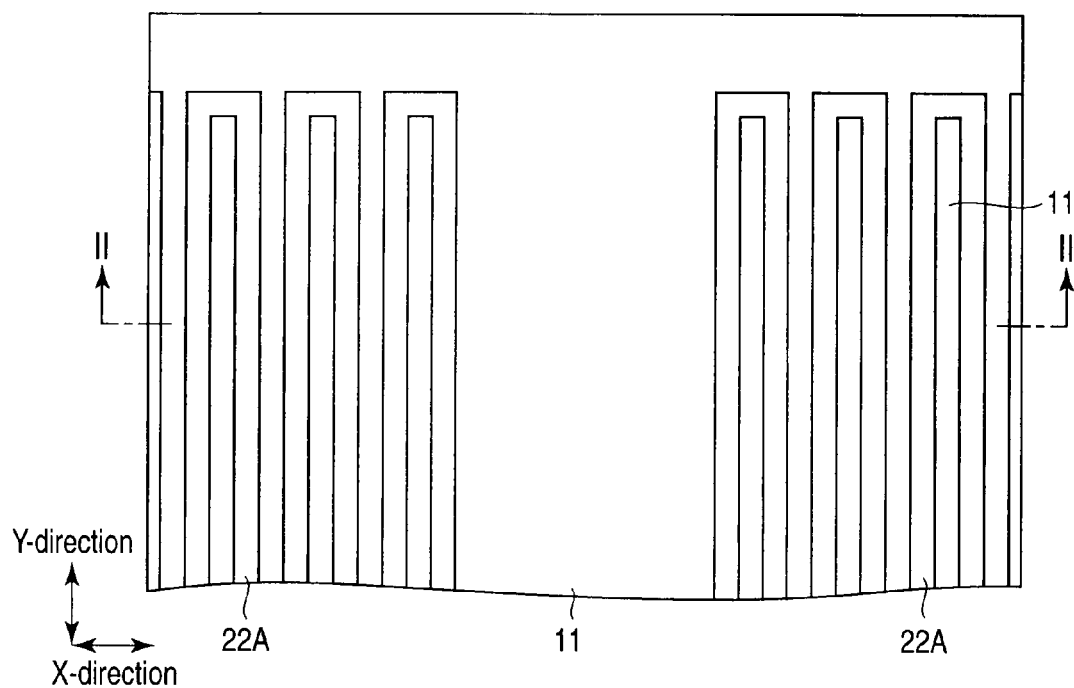
FIG. 10 is a plan view showing a step in the manufacture of the semiconductor device following FIG. 8.
Figure 11:
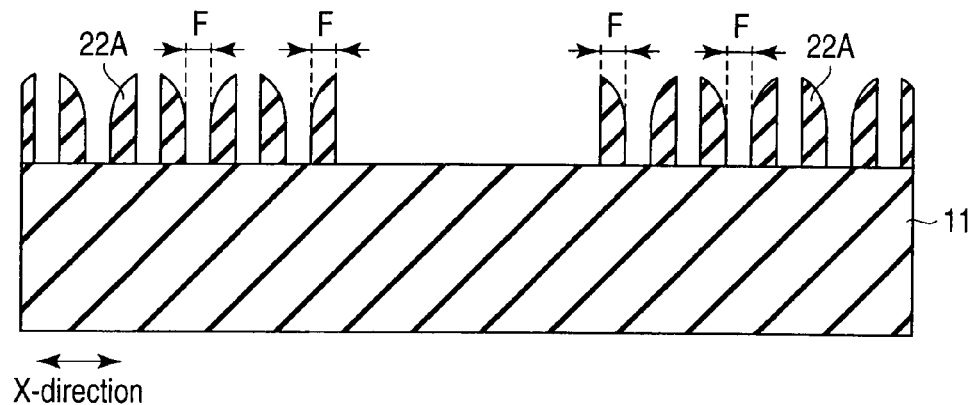
FIG. 11 is a sectional view showing a step in the manufacture of the semiconductor device taken along line II-II in FIG. 10.
Figure 12:
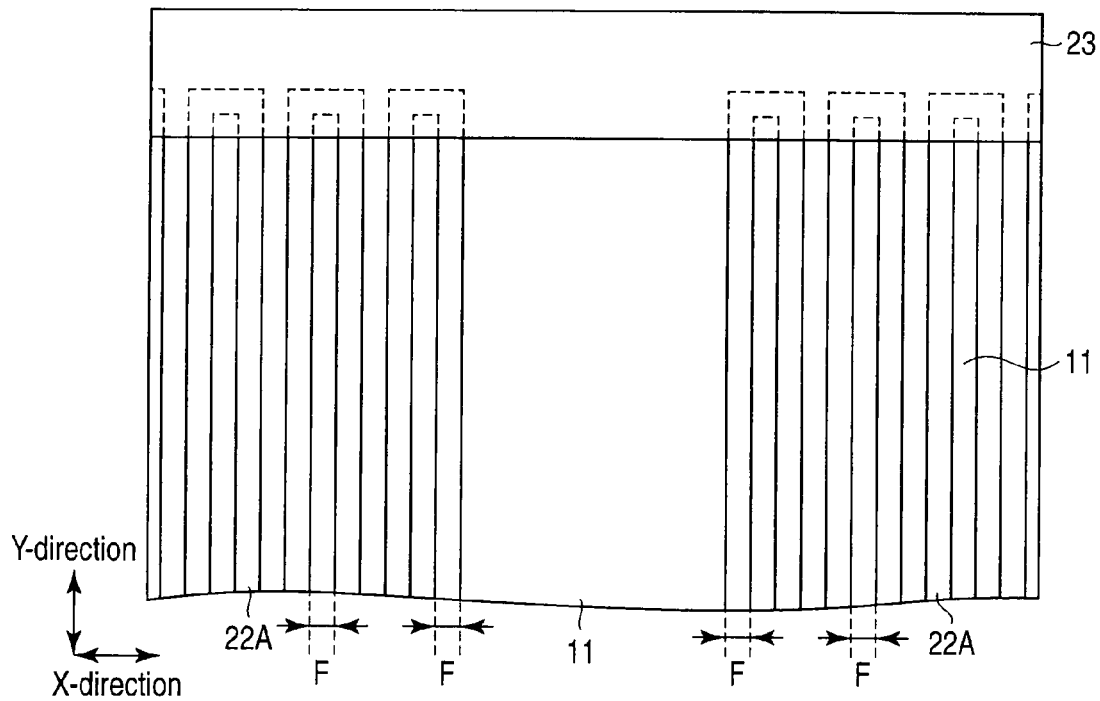
FIG. 12 is a plan view showing a step in the manufacture of the semiconductor device following FIG. 10.

As shown in FIGS. 10 and 11, the mask layers 21A and 21B are removed by, e.g., wet etching. Only the plurality of sidewalls 22A each having the width "F" remain on the insulating layer 11. Next, as shown in FIG. 12, a peripheral region except a region (to be referred to as an interconnection region hereinafter) where interconnection layers should be formed is covered with a resist layer 23 by lithography.

Figure 13:
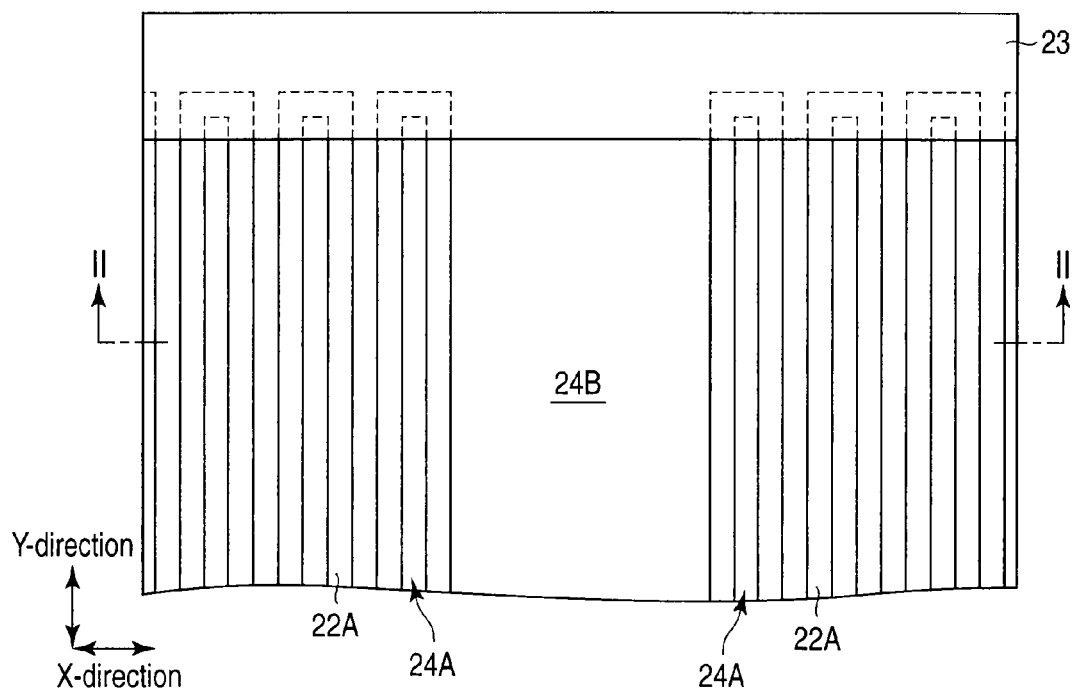
FIG. 13 is a plan view showing a step in the manufacture of the semiconductor device following FIG. 12.
Figure 14:
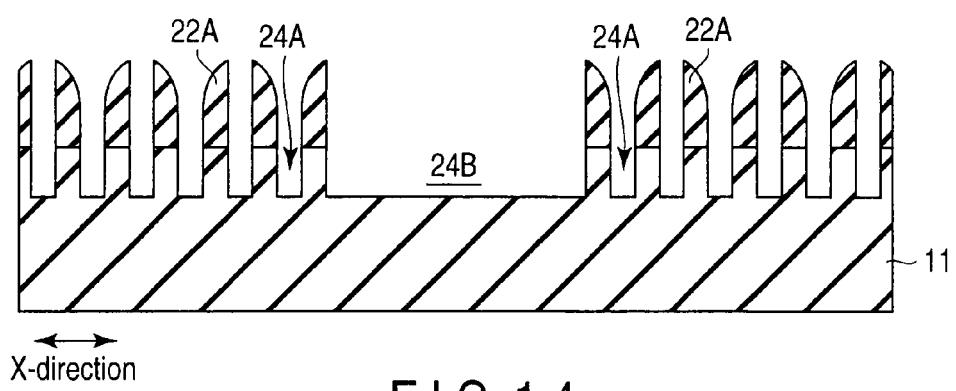
FIG. 14 is a sectional view showing a step in the manufacture of the semiconductor device taken along line II-II in FIG. 13.

As shown in FIGS. 13 and 14, the insulating layer 11 is selectively etched by, e.g., RIE using the sidewalls 22A as a mask to form a plurality of trenches 24A and a trench 24B wider than the trench 24A in the insulating layer 11. The width of the trench 24A is set to "F". The width of the trench 24B is set to "2F×n−F".

Figure 15:
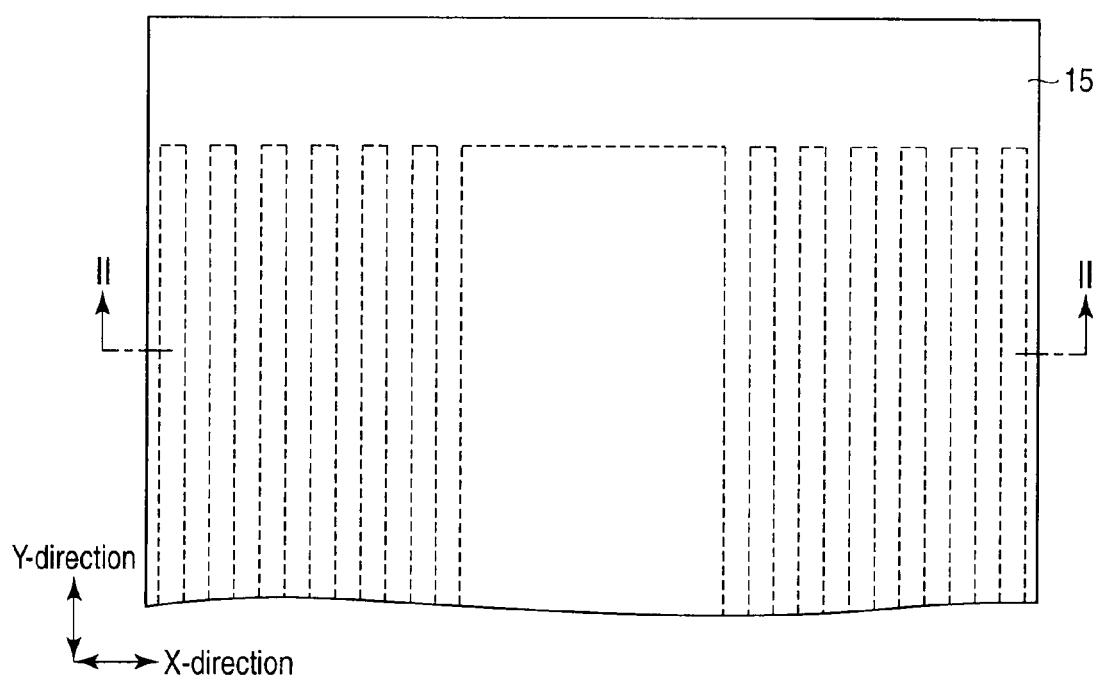
FIG. 15 is a plan view showing a step in the manufacture of the semiconductor device following FIG. 13.
Figure 16A:
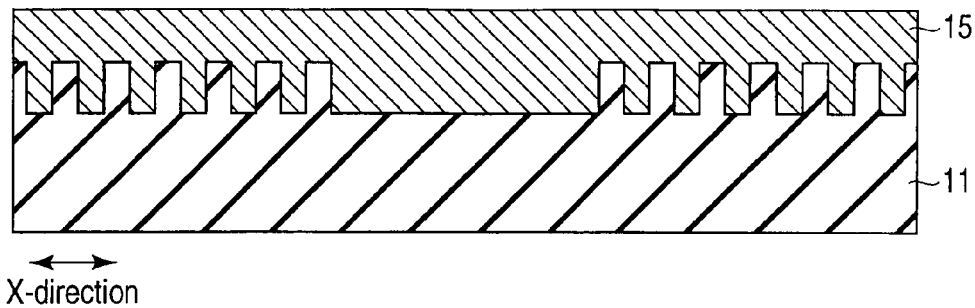
FIG. 16A is a sectional view showing a step in the manufacture of the semiconductor device taken along line II-II in FIG. 15.

As shown in FIGS. 15 and 16A, the resist layer 23 and the sidewalls 22A formed in the peripheral region are removed. A conductor 15 is deposited on the entire device by, e.g., CVD or metal plating.

Then, as shown in FIGS. 1 and 2, the upper surface of the device is planarized by, e.g., chemical mechanical polishing (CMP). With this process, the plurality of first interconnection layers 12 and one second interconnection layer 13 having a width larger than that of the first interconnection layer 12 are formed in the insulating layer 11. The semiconductor device of this embodiment is formed in this way.

As described above in detail, according to this embodiment, it is possible to form the plurality of first interconnection layers 12 each having a width smaller than the minimum feature size "2F". It is also possible to form, between the first interconnection layers 12, the one second interconnection layer 13 having a width larger than that of the first interconnection layer 12. The width of the second interconnection layer 13 is "2F×n−F". Additionally, all of the spaces between the first interconnection layers 12 and the spaces between the first interconnection layers 12 and the second interconnection layer 13 in the X-direction can be set to "F". This enables to microfabricate a semiconductor device including a plurality of interconnection layers with different widths and, more particularly, to microfabricate a semiconductor device in the X-direction.

According to this embodiment, it is possible to form the first interconnection layers 12 and the second interconnection layer 13 in a single lithography process. That is, the plurality of interconnection layers having different widths can be formed simultaneously. This obviates the need for ensuring an alignment margin between the first interconnection layers 12 and the second interconnection layer 13 in the process (especially, exposure process). It is therefore possible to set the spaces between the first interconnection layers 12 and the second interconnection layer 13 to "F" and decrease the number of steps in the manufacture.

Figure 16B:
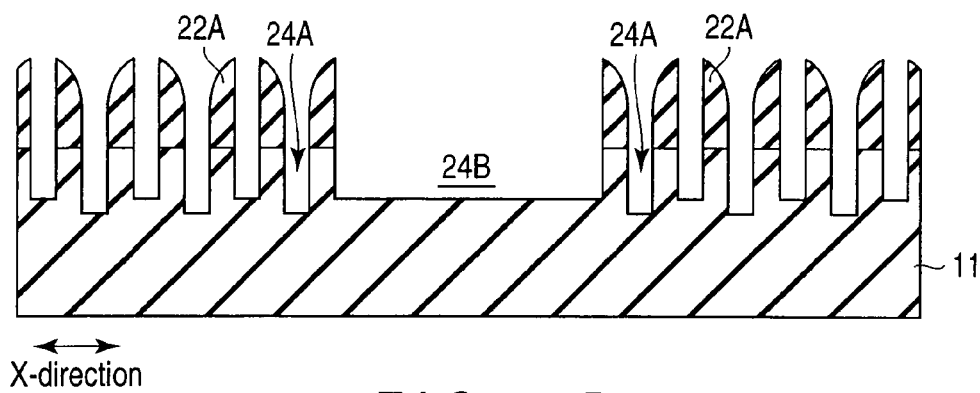
FIG. 16B is a sectional view showing a step in the manufacture of a semiconductor device according to a modification.

When the insulating layer 11 is etched using the sidewalls 22A shown in FIG. 11, the trenches 24A often include shallow and deep trenches that are alternately arranged, as shown in FIG. 16B. This occurs because the upper portions of the sidewalls 22A have asymmetrical shapes, or the width of the mask layer 21A deviates from "F" in the slimming process shown in FIGS. 5 and 6.

Figure 16C:
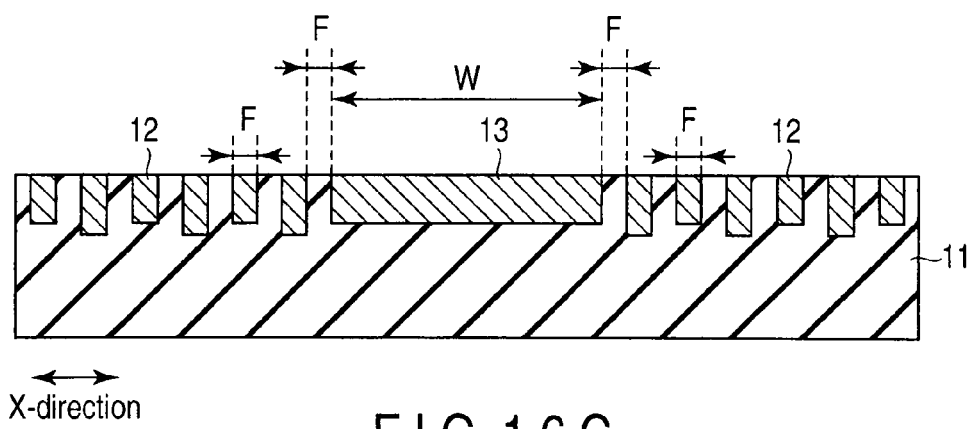
FIG. 16C is a sectional view showing the arrangement of the semiconductor device according to the modification.

The process shown in FIGS. 15 and 16A then yields a structure shown in FIG. 16C, in which the first interconnection layers 12 include shallow and deep interconnections which are alternately arranged and have upper surfaces flush with each other. That is, interconnections formed in a pattern having a width and space smaller than the resolution limit of the exposure technique often have the shape shown in FIG. 16C.

Second Embodiment

A semiconductor device according to the second embodiment includes a plurality of first interconnection layers 12 each having a width "F", and a plurality of second interconnection layers 13 each of which has a width larger than "F" and is arranged between the first interconnection layers 12.

Figure 17:
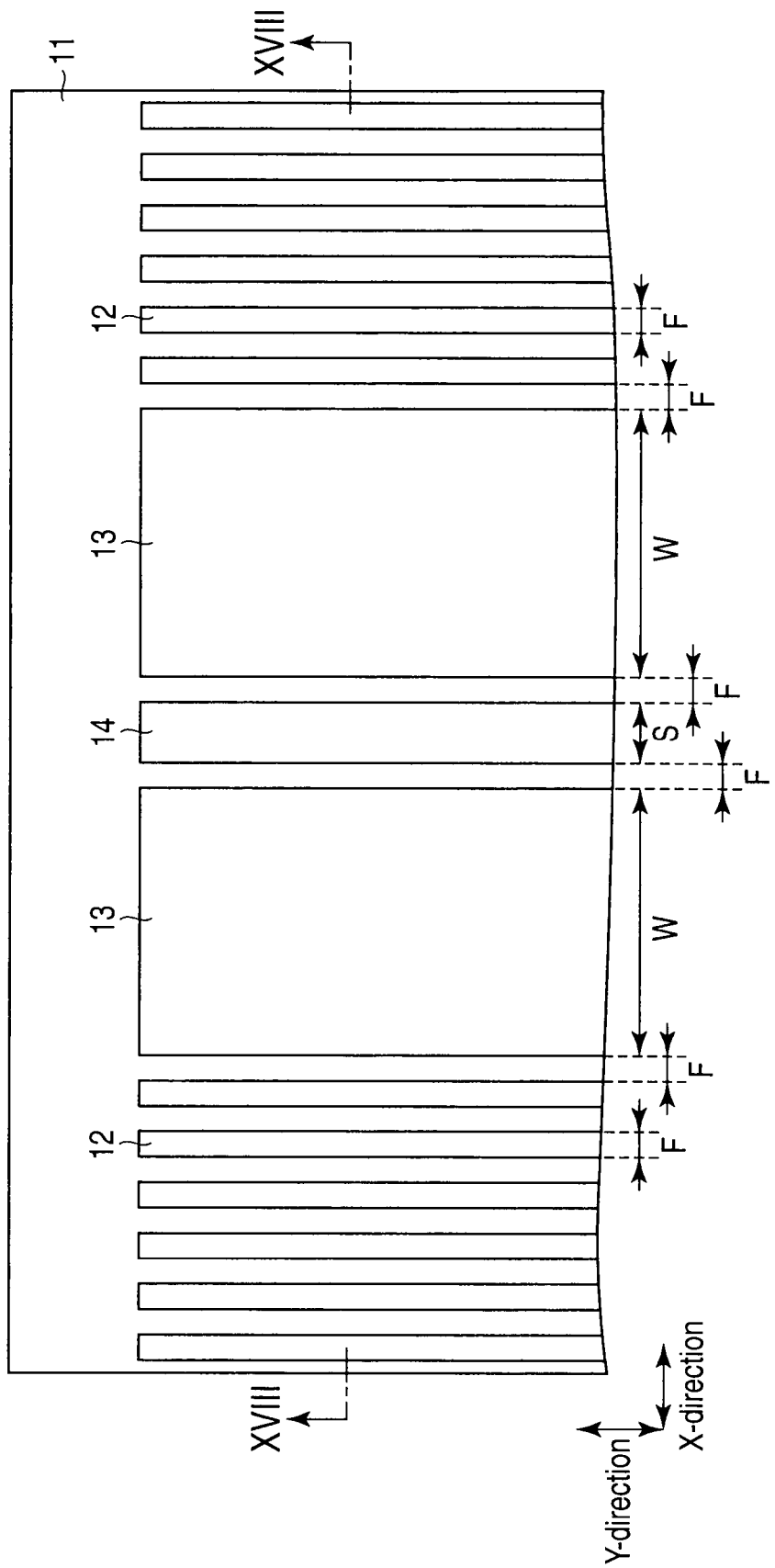
FIG. 17 is a plan view showing the arrangement of a semiconductor device according to the second embodiment of the present invention.
Figure 18:
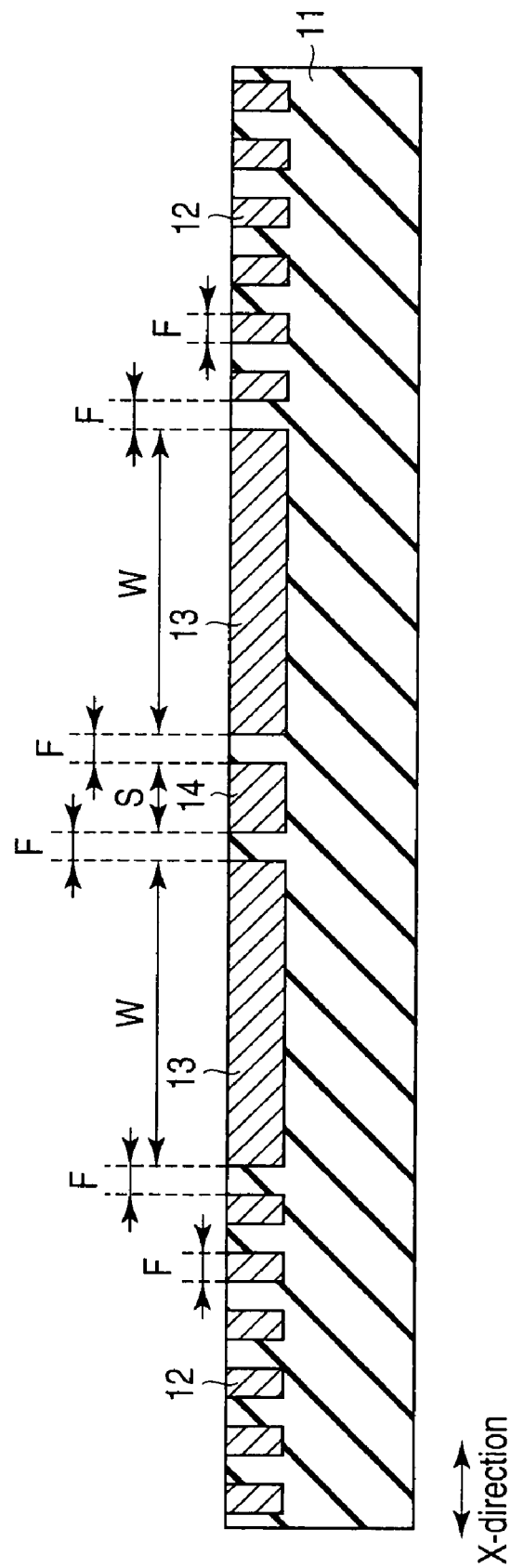
FIG. 18 is a sectional view of the semiconductor device taken along line XVIII-XVIII in FIG. 17.

FIG. 17 is a plan view showing the arrangement of the semiconductor device according to the second embodiment of the present invention. FIG. 18 is a sectional view of the semiconductor device taken along line XVIII-XVIII in FIG. 17.

A plurality of interconnection layers running in the Y-direction are formed in an interlayer dielectric film 11. The plurality of interconnection layers formed in the interlayer dielectric film 11 include the plurality of first interconnection layers 12 each having the width "F", two second interconnection layers 13 which are formed between the plurality of first interconnection layers 12 and have a width W larger than "F", and a third interconnection layer 14 which is formed between the two second interconnection layers 13 and has a width S equal to or larger then "F". The width W of the second interconnection layer 13 is larger than the width S of the third interconnection layer 14.

All the spaces between the interconnection layers 12, 13, and 14 in the X-direction are set to "F". This allows microfabrication in the X-direction. It is therefore possible to reduce the area of the semiconductor device including a plurality of interconnection layers with desired widths.

The first interconnection layers 12, the second interconnection layers 13, and the third interconnection layer 14 are made of, e.g., a simple substance of copper (Cu), aluminum (Al), or ruthenium (Ru), or mixed interconnections containing two or more kinds of materials, as in the first embodiment.

A method of manufacturing the semiconductor device according to the second embodiment will be described next with reference to the accompanying drawing. FIGS. 19, 21, 24, 26, 28, 29, and 31 are plan views for explaining steps in the manufacture. FIGS. 20, 22, 23, 25, 27, 30, and 32 are sectional views taken along line XVIII-XVIII in the plan views.

Figure 19:
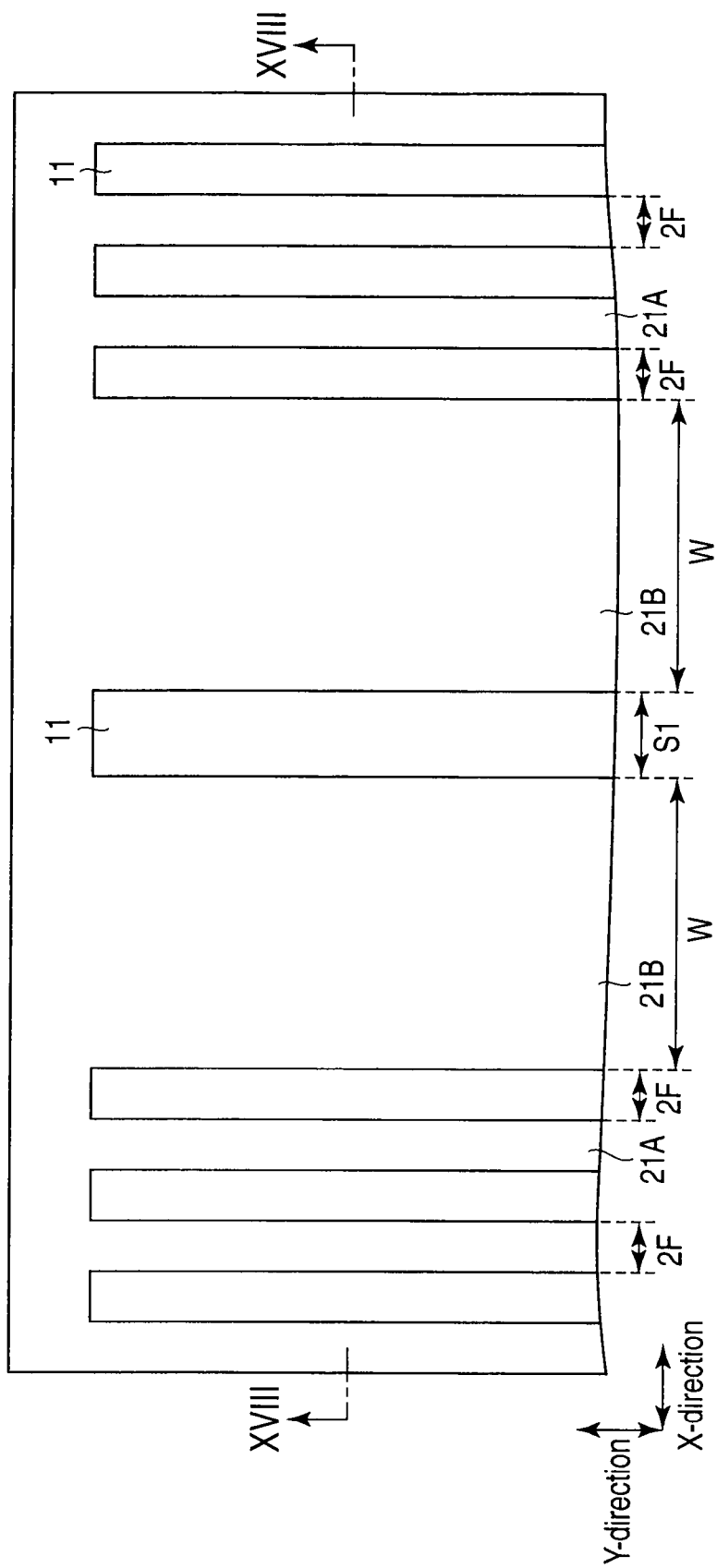
FIG. 19 is a plan view showing a step in the manufacture of the semiconductor device according to the second embodiment.
Figure 20:
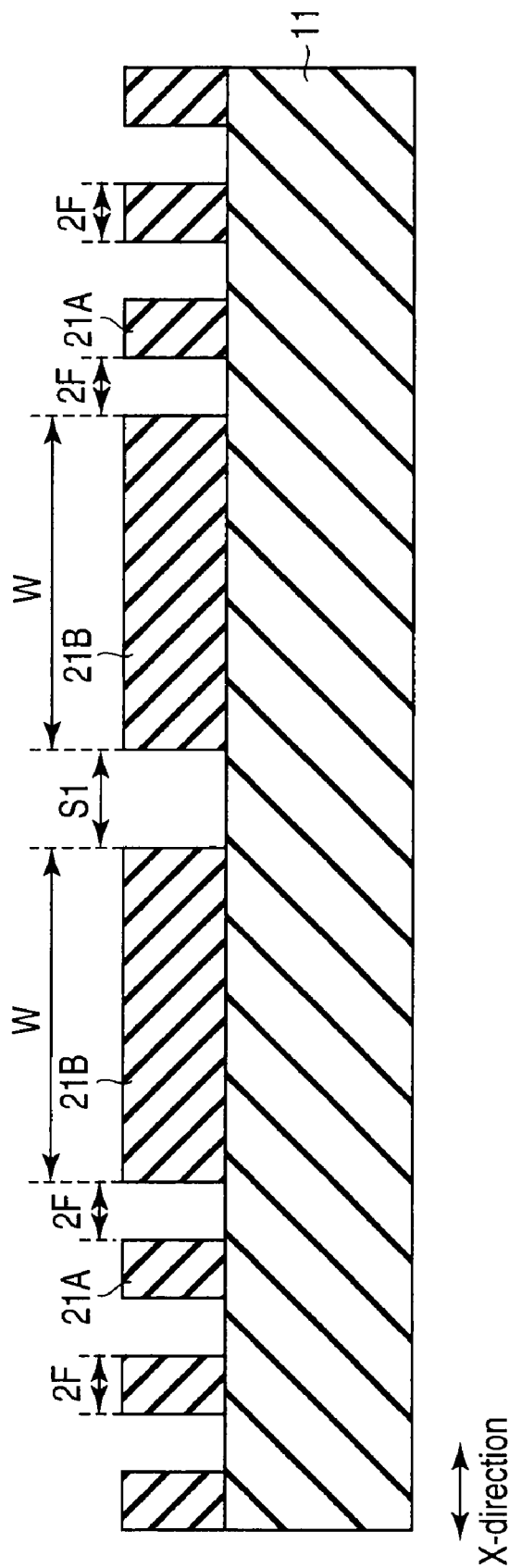
FIG. 20 is a sectional view showing a step in the manufacture of the semiconductor device taken along line XVIII-XVIII in FIG. 19.

As shown in FIGS. 19 and 20, a mask layer 21 having an etching selectivity with respect to the insulating layer 11 is deposited on the insulating layer 11 by, e.g., CVD. The mask layer 21 is patterned by lithography and RIE to form a plurality of mask layers 21A each of which has a width "2F" equal to the minimum feature size ascribable to the exposure technique and two mask layers 21B which have a width larger than "2F" and are arranged between the mask layers 21A.

The width W of the mask layer 21B is set to n (n is a natural number of 1 or more) times of the width "2F" of the mask layer 21A. The space between the mask layers 21A adjacent in the X-direction is set to "2F". Hence, the X-direction pitch of the pattern in the region where the plurality of mask layers 21A are formed is set to "4F". The space between the mask layers 21A and 21B adjacent in the X-direction is set to "2F". A space S1 between the two mask layers 21B is set to "2F" or more. When space S1 is also set to a multiple of "2F", the pattern margin in lithography improves.

Figure 21:
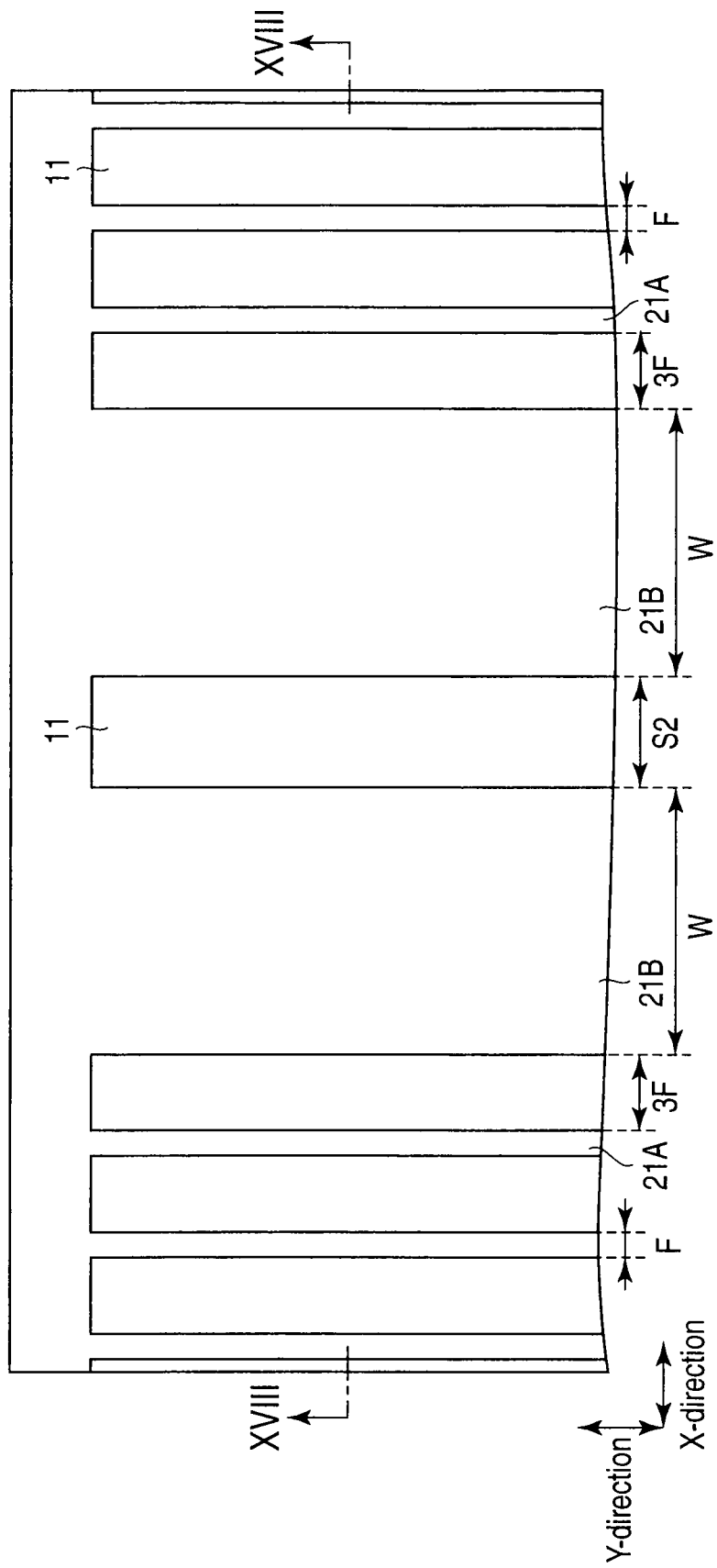
FIG. 21 is a plan view showing a step in the manufacture of the semiconductor device following FIG. 19.
Figure 22:
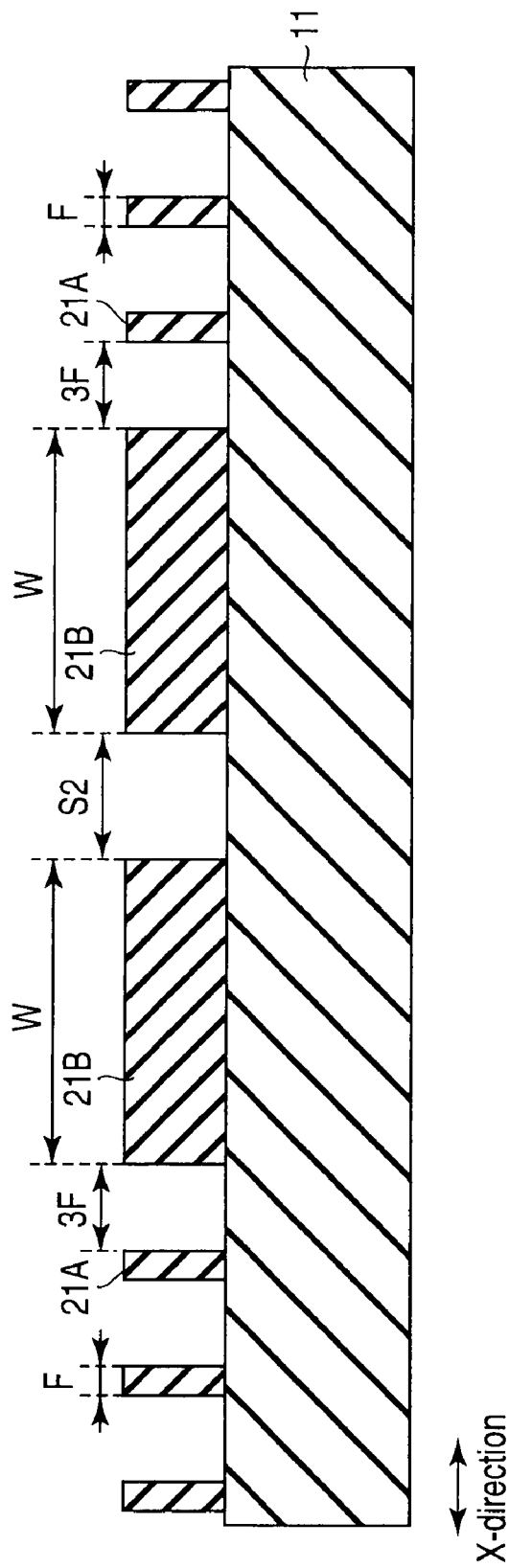
FIG. 22 is a sectional view showing a step in the manufacture of the semiconductor device taken along line XVIII-XVIII in FIG. 21.

Next, as shown in FIGS. 21 and 22, a slimming process using, e.g., wet etching is performed to further microfabricate the mask layers 21A and 21B. With this process, the width of the mask layer 21A is set to "F", and the width W of the mask layer 21B is set to "2F×n−F". The space between the mask layers 21A adjacent in the X-direction is set to "3F". The space between the mask layers 21A and 21B adjacent to each other is set to "3F". A space S2 between the two mask layers 21B in the X-direction is set to "S1+F". For example, when space S1 is "4F", space S2 is "5F".

Figure 23:
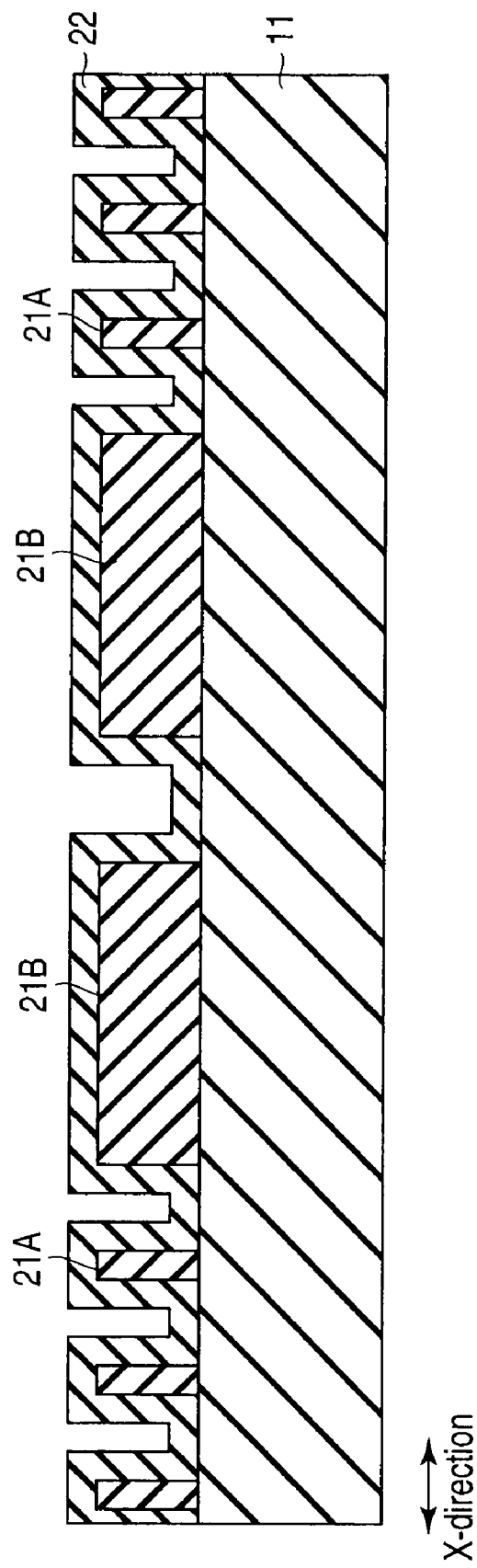
FIG. 23 is a sectional view showing a step in the manufacture of the semiconductor device following FIG. 22.

As shown in FIG. 23, an insulating layer 22 is deposited on the entire device by, e.g., CVD. The insulating layer 22 is made of a material having an etching selectivity with respect to the insulating layer 11 and the mask layer 21.

Figure 24:
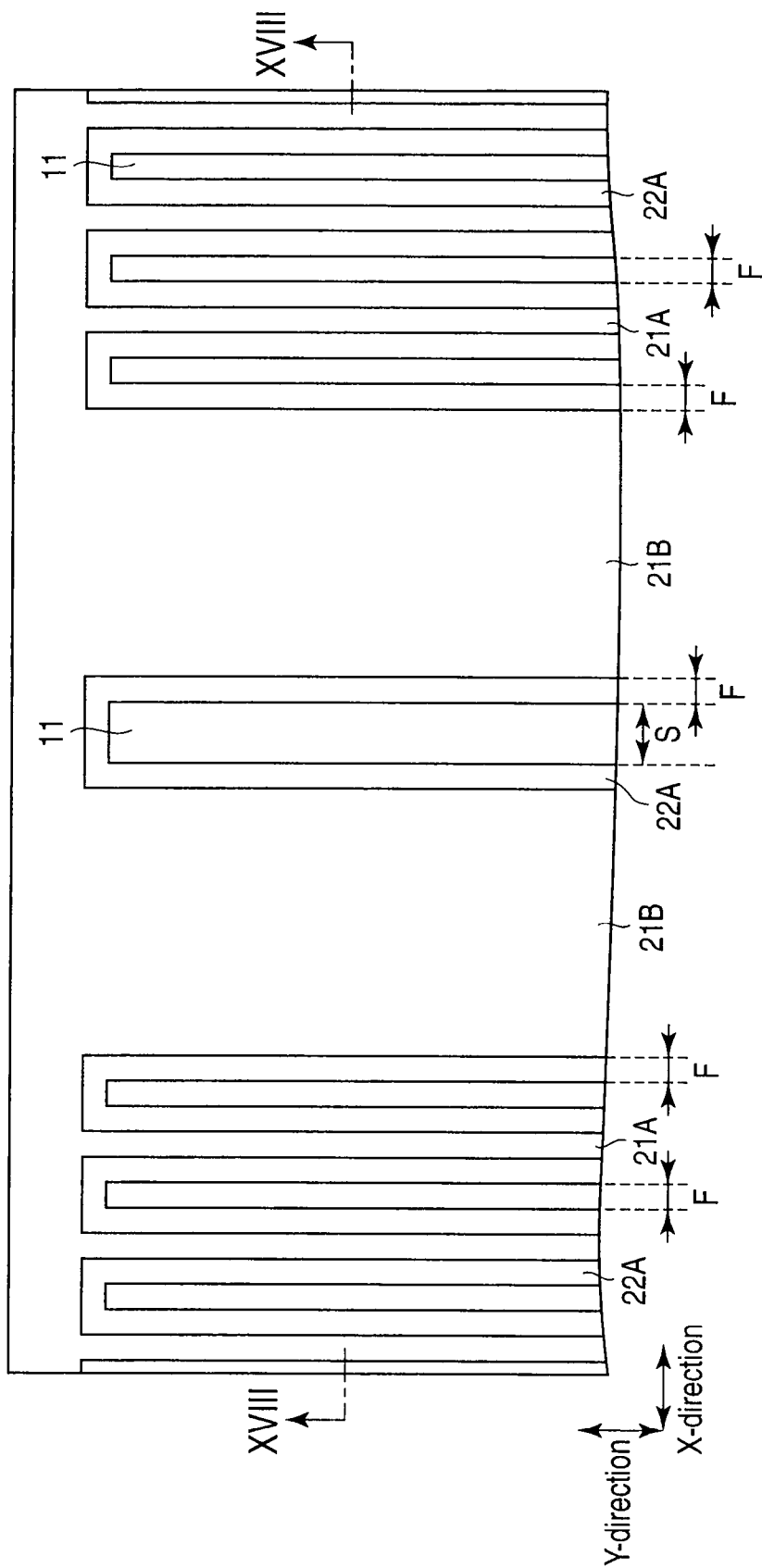
FIG. 24 is a plan view showing a step in the manufacture of the semiconductor device following FIG. 23.
Figure 25:
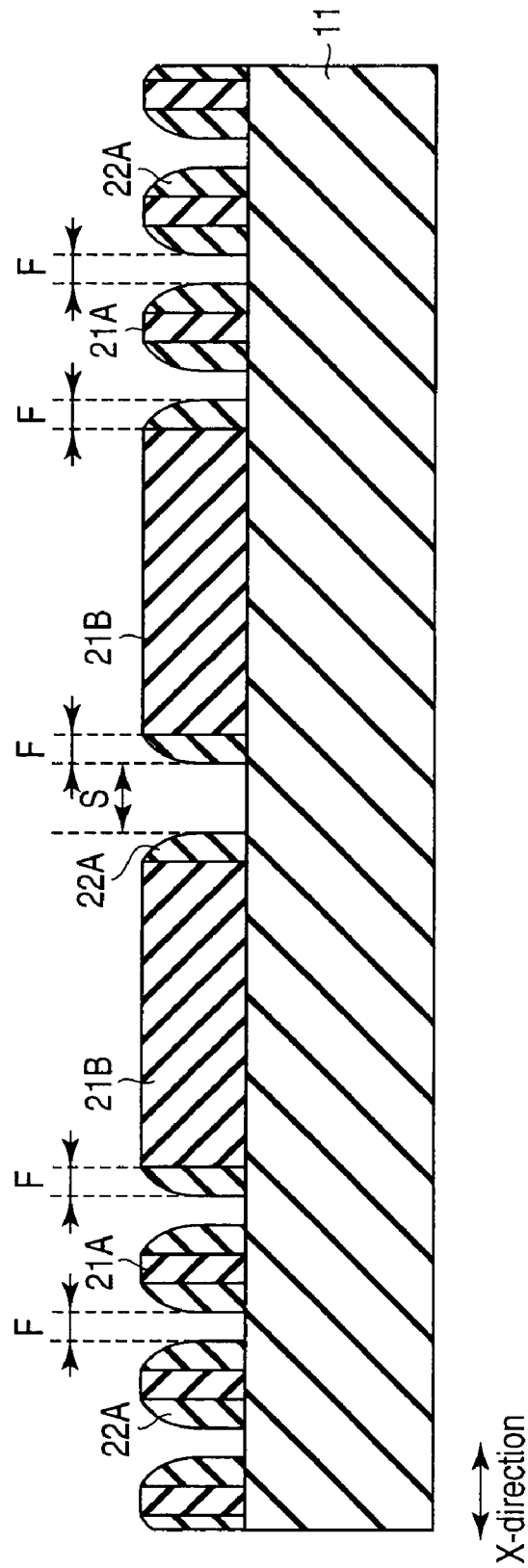
FIG. 25 is a sectional view showing a step in the manufacture of the semiconductor device taken along line XVIII-XVIII in FIG. 24.

As shown in FIGS. 24 and 25, the insulating layer 22 is selectively etched by, e.g., RIE to form a plurality of sidewalls 22A on the side surfaces of the mask layers 21A and 21B. The width of each sidewall 22A is set to "F". The X-direction space between the sidewalls 22A formed in the region including the mask layers 21A is set to "F". The X-direction space S between the sidewalls 22A arranged between the two mask layers 21B is set to "S2−2F". For example, when space S1 is "4F", space S is "3F" because space S2 is "5F".

Figure 26:
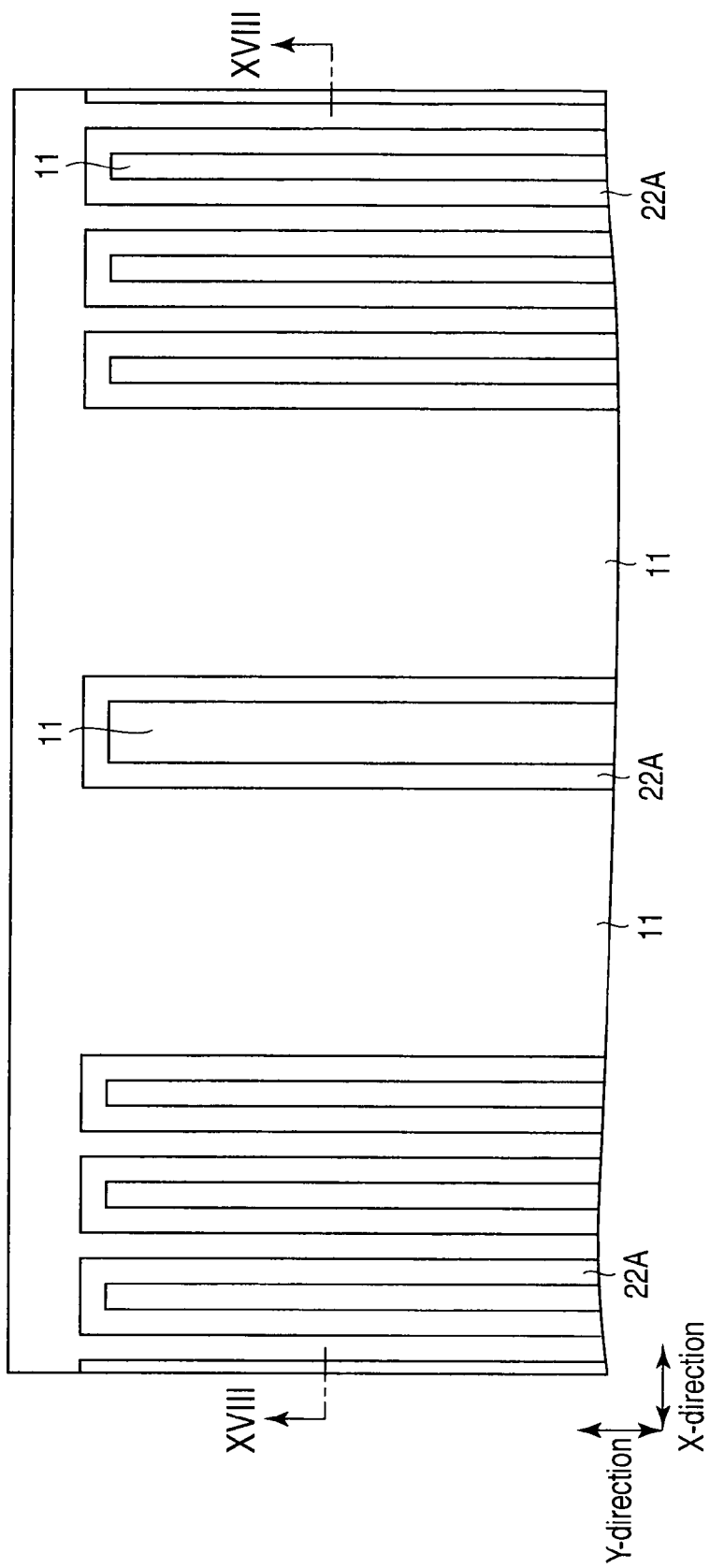
FIG. 26 is a plan view showing a step in the manufacture of the semiconductor device following FIG. 24.
Figure 27:
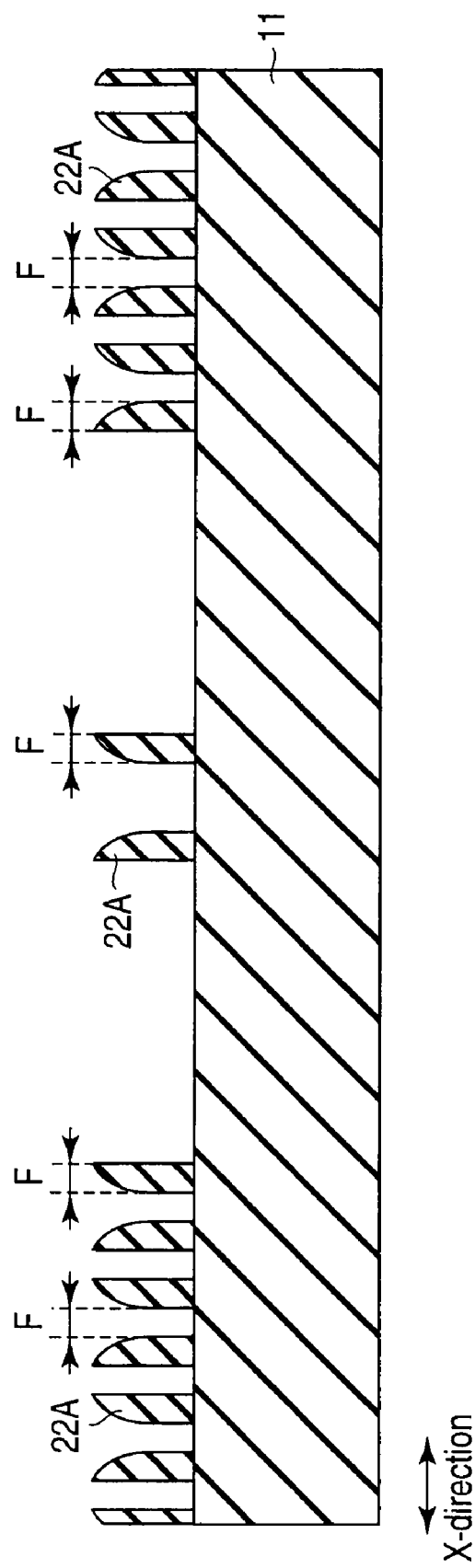
FIG. 27 is a sectional view showing a step in the manufacture of the semiconductor device taken along line XVIII-XVIII in FIG. 26.
Figure 28:
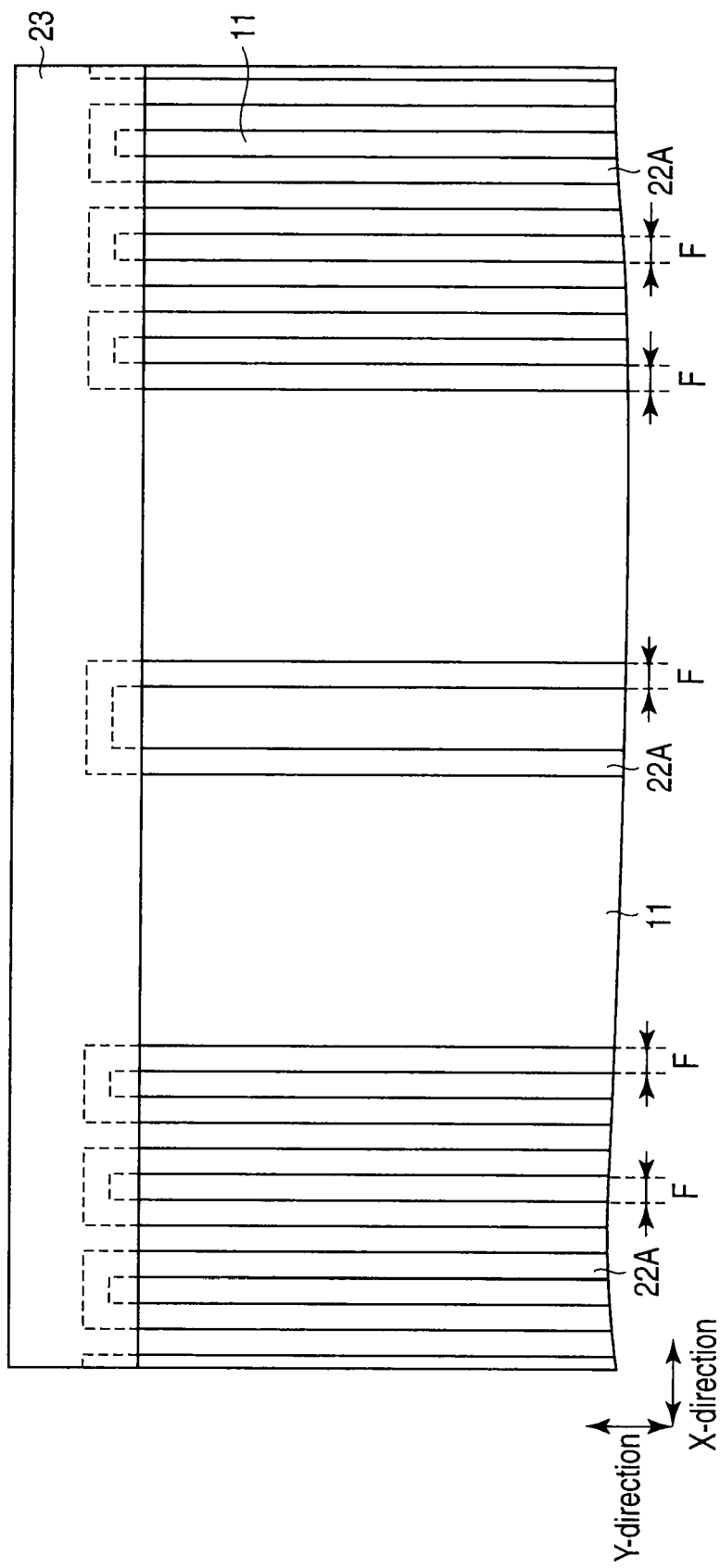
FIG. 28 is a plan view showing a step in the manufacture of the semiconductor device following FIG. 26.

As shown in FIGS. 26 and 27, the mask layers 21A and 21B are removed by, e.g., wet etching. Only the plurality of sidewalls 22A each having the width "F" remain on the insulating layer 11. Next, as shown in FIG. 28, a peripheral region is covered with a resist layer 23 by lithography.

Figure 29:
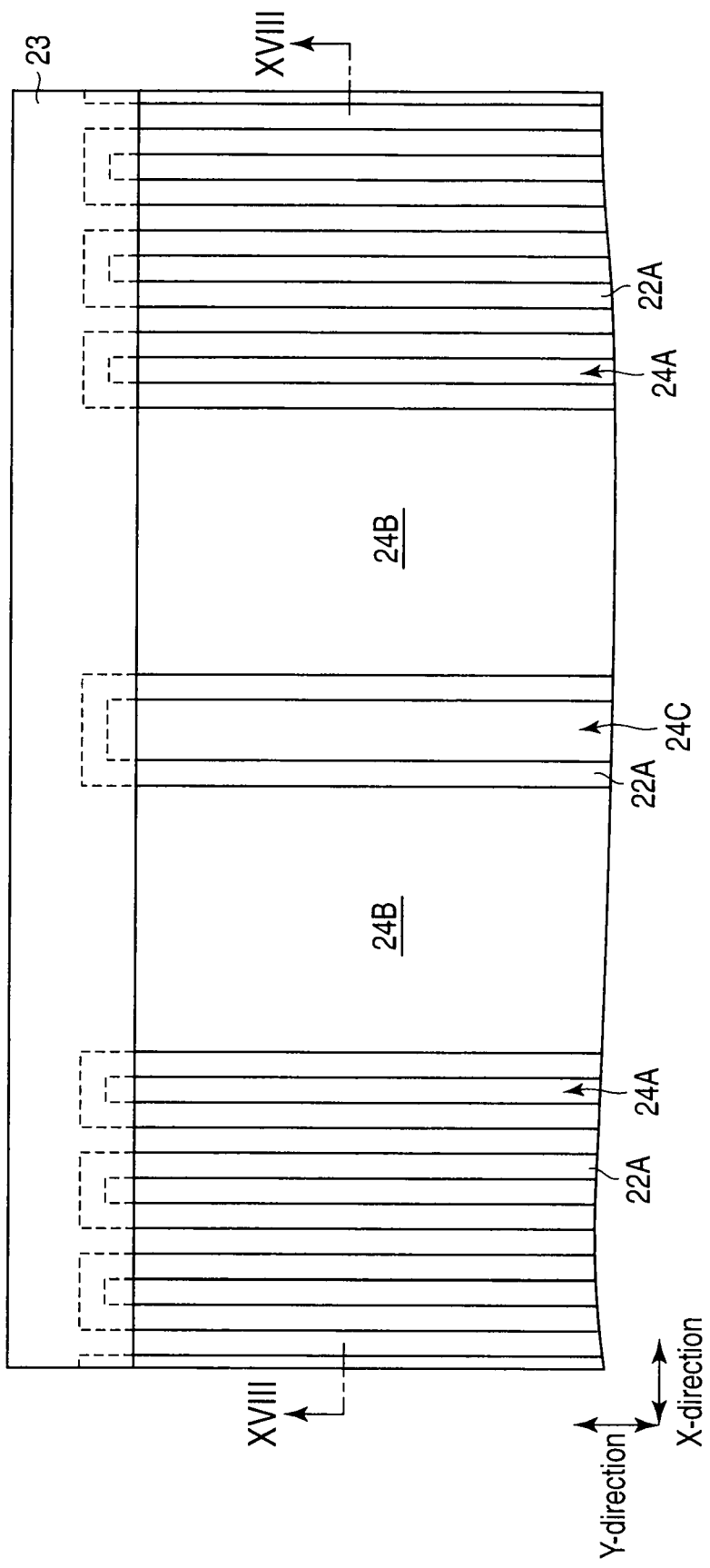
FIG. 29 is a plan view showing a step in the manufacture of the semiconductor device following FIG. 28.
Figure 30:
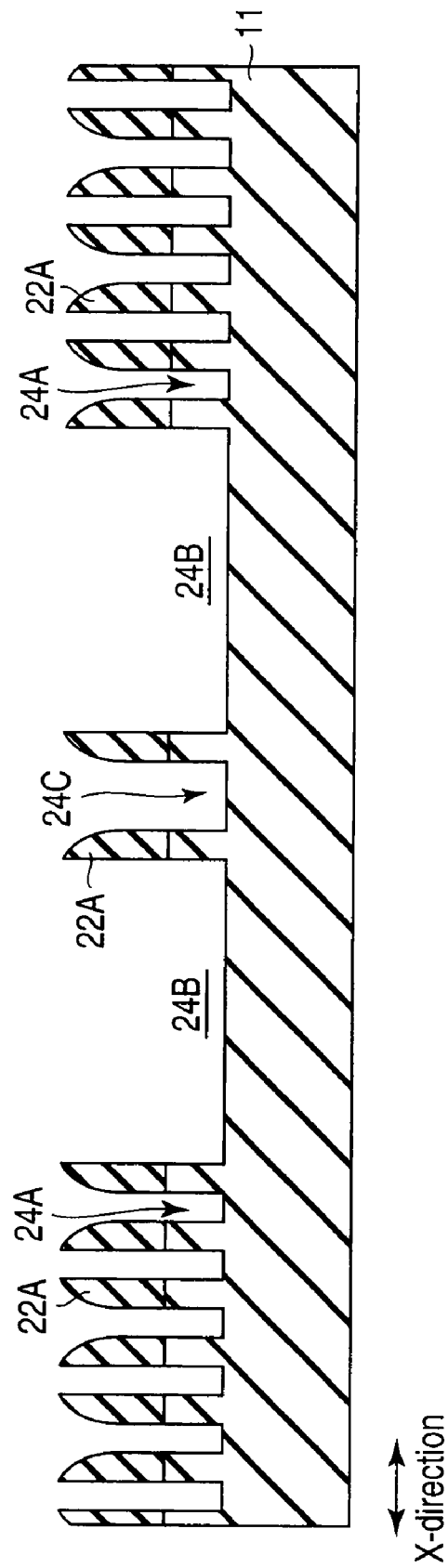
FIG. 30 is a sectional view showing a step in the manufacture of the semiconductor device taken along line XVIII-XVIII in FIG. 29.

As shown in FIGS. 29 and 30, the insulating layer 11 is selectively etched by, e.g., RIE using the sidewalls 22A as a mask to form a plurality of trenches 24A, two trenches 24B wider than the trench 24A, and a trench 24C wider than the trench 24A in the insulating layer 11. The width of the trench 24A is set to "F". The width of the trench 24B is set to "2F×n−F". The width of the trench 24C is set to "S". For example, when space S1 is "4F", space S is "3F". More specifically, the width of the third interconnection layer 14 is preferably "2F×m−F" in consideration of the pattern margin in lithography (m is a natural number of 1 or more).

Figure 31:
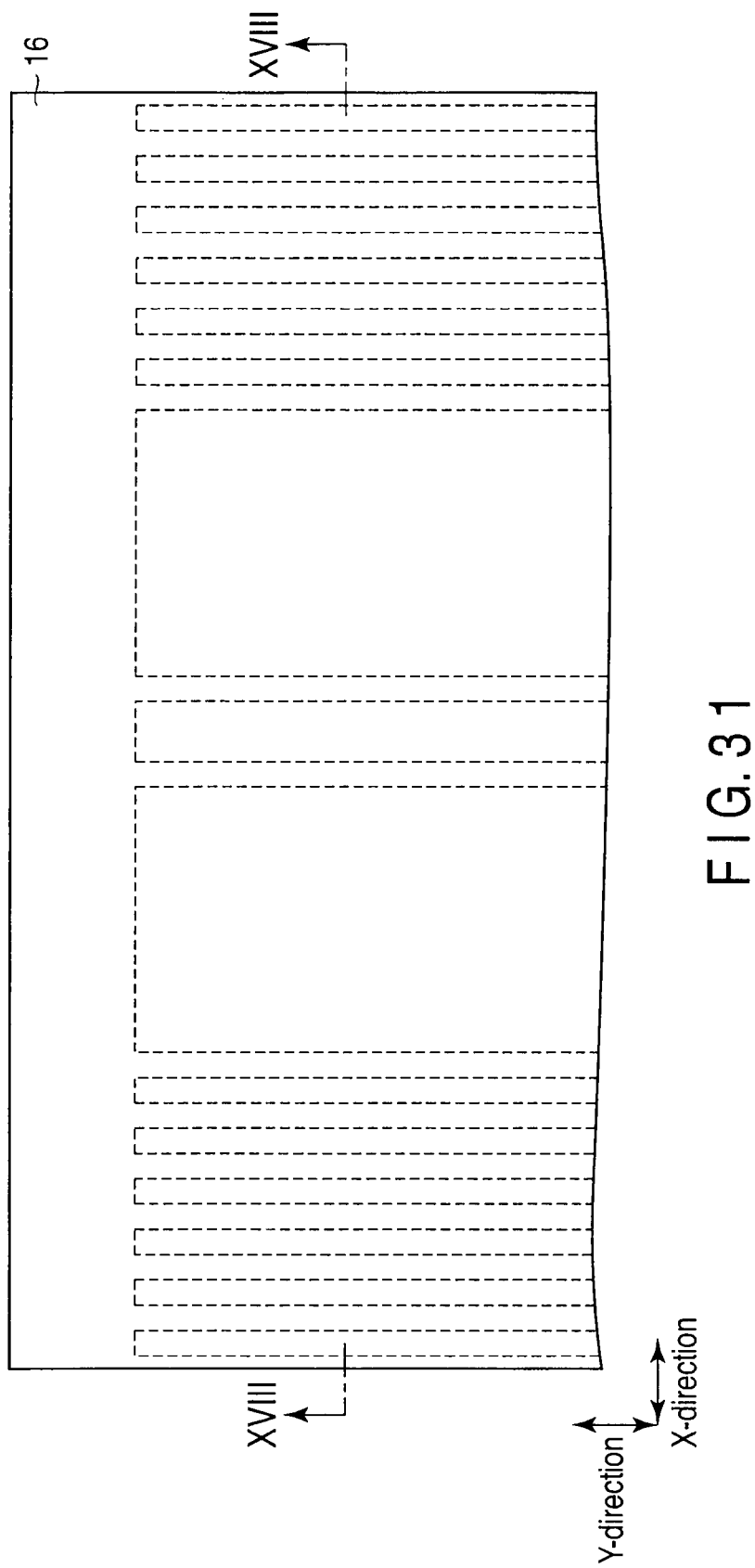
FIG. 31 is a plan view showing a step in the manufacture of the semiconductor device following FIG. 29.
Figure 32:
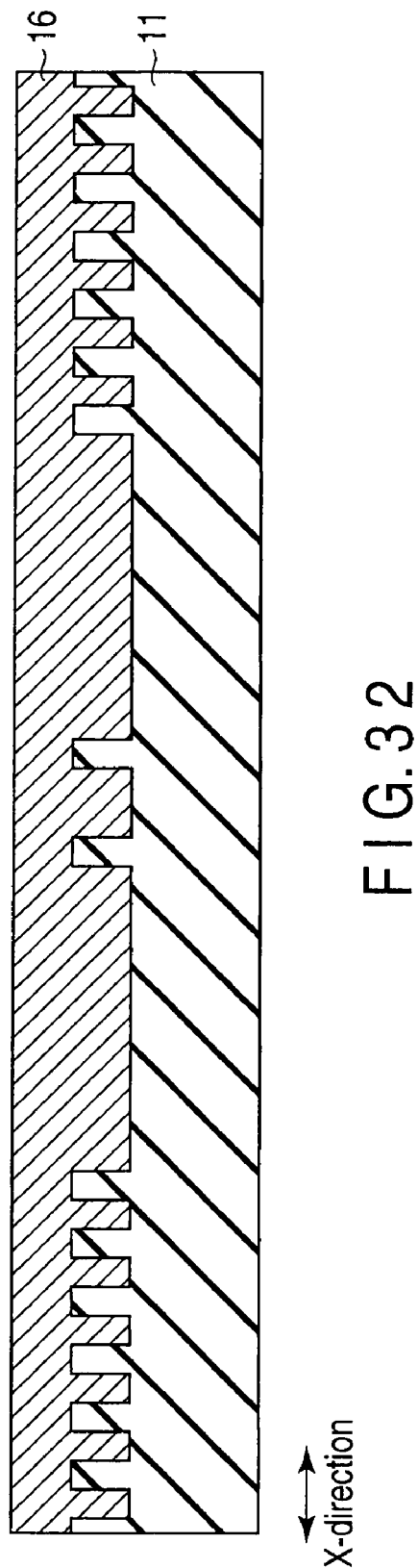
FIG. 32 is a sectional view showing a step in the manufacture of the semiconductor device taken along line XVIII-XVIII in FIG. 31.

As shown in FIGS. 31 and 32, the resist layer 23 and the sidewalls 22A formed in the peripheral region are removed. A conductor 16 is deposited on the entire device by, e.g., CVD or metal plating.

Then, as shown in FIGS. 17 and 18, the upper surface of the device is planarized by, e.g., CMP. With this process, the plurality of first interconnection layers 12, the two second interconnection layers 13 each having a width larger than that of the first interconnection layer 12, and the one third interconnection layer 14 having a width equal to or larger than that of the first interconnection layer 12 are formed in the insulating layer 11. The semiconductor device of this embodiment is formed in this way.

As described above in detail, according to this embodiment, it is possible to form, between the first interconnection layers 12, the two second interconnection layers 13 each having a width larger than that of the first interconnection layer 12. The width of the second interconnection layer 13 is "2F×n−F". It is also possible to form, between the second interconnection layers 13, the one third interconnection layer 14 having a width equal to or larger than that of the first interconnection layer 12. The width of the third interconnection layer 14 is preferably "2F×m−F". Additionally, all of the spaces between the first interconnection layers 12, the spaces between the first interconnection layers 12 and the second interconnection layers 13, and the spaces between the second interconnection layers 13 and the third interconnection layer 14 can be set to "F". This enables to microfabricate a semiconductor device including a plurality of interconnection layers with different widths. The remaining effects are the same as in the first embodiment.

Third Embodiment

In the third embodiment, the line-and-space patterns of the first and second embodiments are applied to a NAND flash memory.

FIG. 33 is a circuit diagram showing the arrangement of one memory block BLK included in a NAND flash memory according to the third embodiment of the present invention.

The memory block BLK includes (m+1) NAND strings (m is a natural number of 1 or more) arranged in the X-direction. Each NAND string includes select transistors ST1 and ST2, and a plurality of memory cell transistors MT (in this embodiment, 32 memory cell transistors MT are shown as an example). Select transistor ST1 included in each of the (m+1) NAND strings has a drain connected to a corresponding one of bit lines BL0 to BLm, and a gate commonly connected to a select gate line SGD. Select transistor ST2 has a source commonly connected to a source line SL, and a gate commonly connected to a select gate line SGS.

In each NAND string, the 32 memory cell transistors MT are arranged between the source of select transistor ST1 and the drain of select transistor ST2 and connect the current paths in series. More specifically, the plurality of memory cell transistors MT are connected in series in the Y-direction so that adjacent transistors share a diffusion region (source or drain region).

The control gate electrodes of the memory cell transistors MT are connected to word lines WL0 to WL31, respectively, sequentially from the memory cell transistor MT closest to the drain side. Hence, the drain of the memory cell transistor MT connected to word line WL0 is connected to the source of select transistor ST1. The source of the memory cell transistor MT connected to word line WL31 is connected to the drain of select transistor ST2.

Word lines WL0 to WL31 commonly connect the control gate electrodes of the memory cell transistors MT between the NAND strings in the memory block BLK. More specifically, the control gate electrodes of the memory cell transistors MT of the same row in the memory block BLK are connected to a single word line WL. The plurality of memory cells connected to the single word line WL is handled as one page. Data write and data read are performed for each page.

The bit lines BL0 to BLm are each connected to the drains of select transistors ST1 in the respective memory blocks BLK. More specifically, the NAND strings of the same column are connected to a single bit line BL in the plurality of memory blocks BLK.

Figure 34:
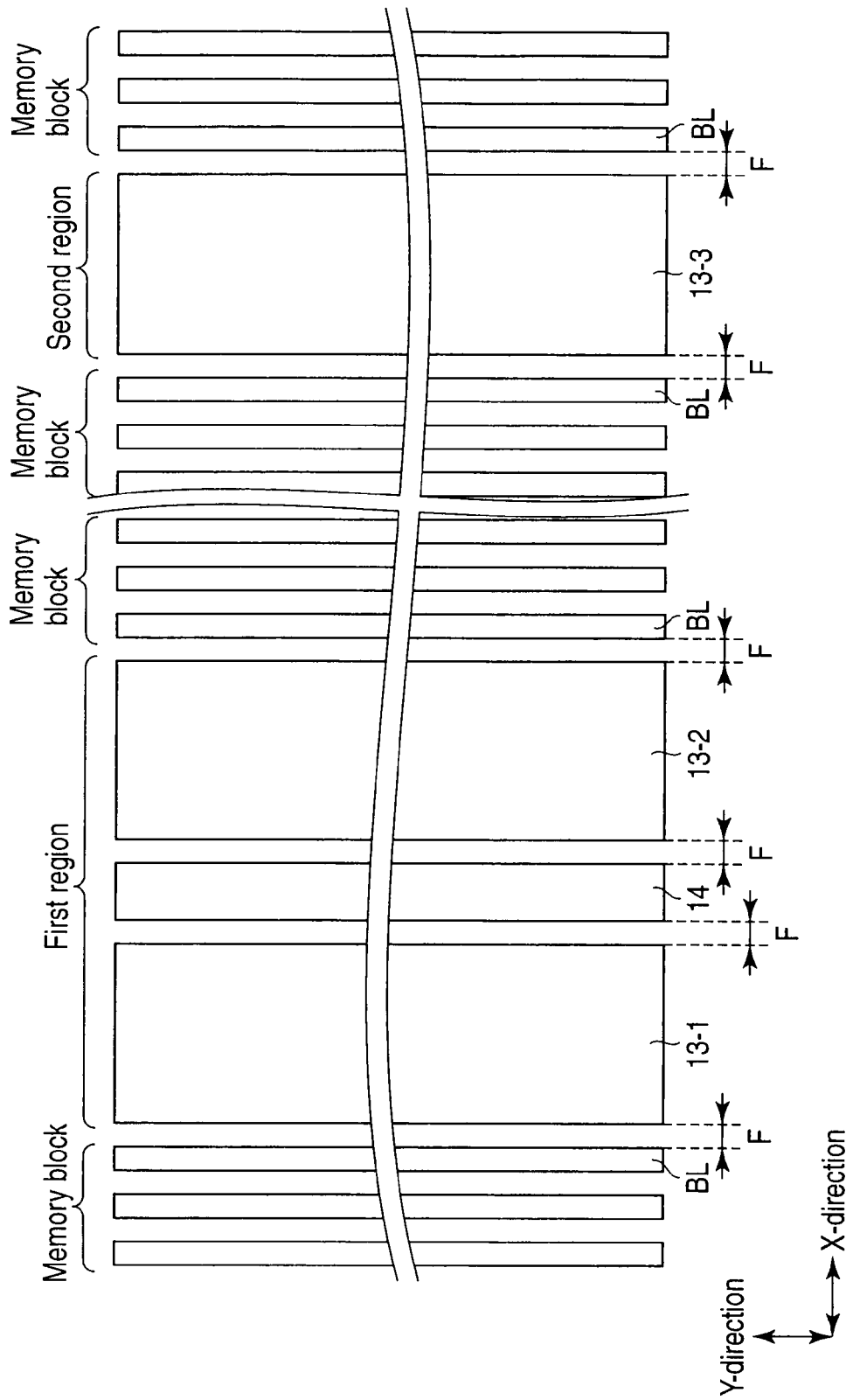
FIG. 34 is a plan view showing the arrangement of the NAND flash memory.

FIG. 34 is a plan view showing the arrangement between the memory blocks BLK of the NAND flash memory. Note that a first metal interconnection layer (first level layer) M0 and a second metal interconnection layer (second level layer) M1 provided on the first metal interconnection layer M0 and including the bit lines BL and shunt interconnections 13-1 to 13-3 are formed on the semiconductor substrate. FIG. 34 shows the arrangement of the second metal interconnection layer (second level layer) M1.

Each memory block BLK includes the plurality of bit lines BL running in the Y-direction. Shunt interconnections 13-1 and 13-2 running in the Y-direction are provided in a first region sandwiched between the memory blocks BLK. A dummy interconnection 14 is provided between shunt interconnections 13-1 and 13-2. Each bit line BL corresponds to the first interconnection layer of the second embodiment and has a width "F". Shunt interconnections 13-1 and 13-2 correspond to the second interconnection layers of the second embodiment and have a width larger than "F". The dummy interconnection 14 corresponds to the third interconnection layer of the second embodiment and has a width equal to or larger than "F". Note that the width of the third interconnection layer is preferably "F" from the viewpoint of size reduction of the NAND flash memory.

Shunt interconnection 13-3 running in the Y-direction is provided in a second region sandwiched between the memory blocks BLK. Each bit line BL corresponds to the first interconnection layer of the first embodiment. Shunt interconnection 13-3 corresponds to the second interconnection layer of the first embodiment and has a width larger than "F".

As described in the first and second embodiments, all the spaces between the bit lines BL, shunt interconnections 13-1 to 13-3, and the dummy interconnection 14 are set to "F". Shunt interconnections 13-1 to 13-3 are arranged between the memory cell arrays (or between the bit lines BL) to the contacts to the substrate, the source line SL, and the like. Shunt interconnections 13-1 to 13-3 handle a voltage higher than that of the bit lines BL and therefore have a width larger than that of the bit lines BL. This makes it possible to supply a stable voltage to the substrate and the like and effectively prevent a voltage drop across the source line SL.

The dummy interconnection 14 provided between shunt interconnections 13-1 and 13-2 allows continuous arrangement of two shunt interconnections. More specifically, it is possible to arrange shunt interconnections 13-1 to 13-3 at short intervals in the direction of the word lines WL and stably apply a potential to the substrate and the like.

The dummy interconnection 14 can also serve as a shield line upon receiving 0 V. This enables stable operation. The dummy interconnection 14 is also usable as a signal line. The bit lines BL adjacent to shunt interconnections 13-1 to 13-3 are sometimes used as dummy bit lines.

Figure 35:
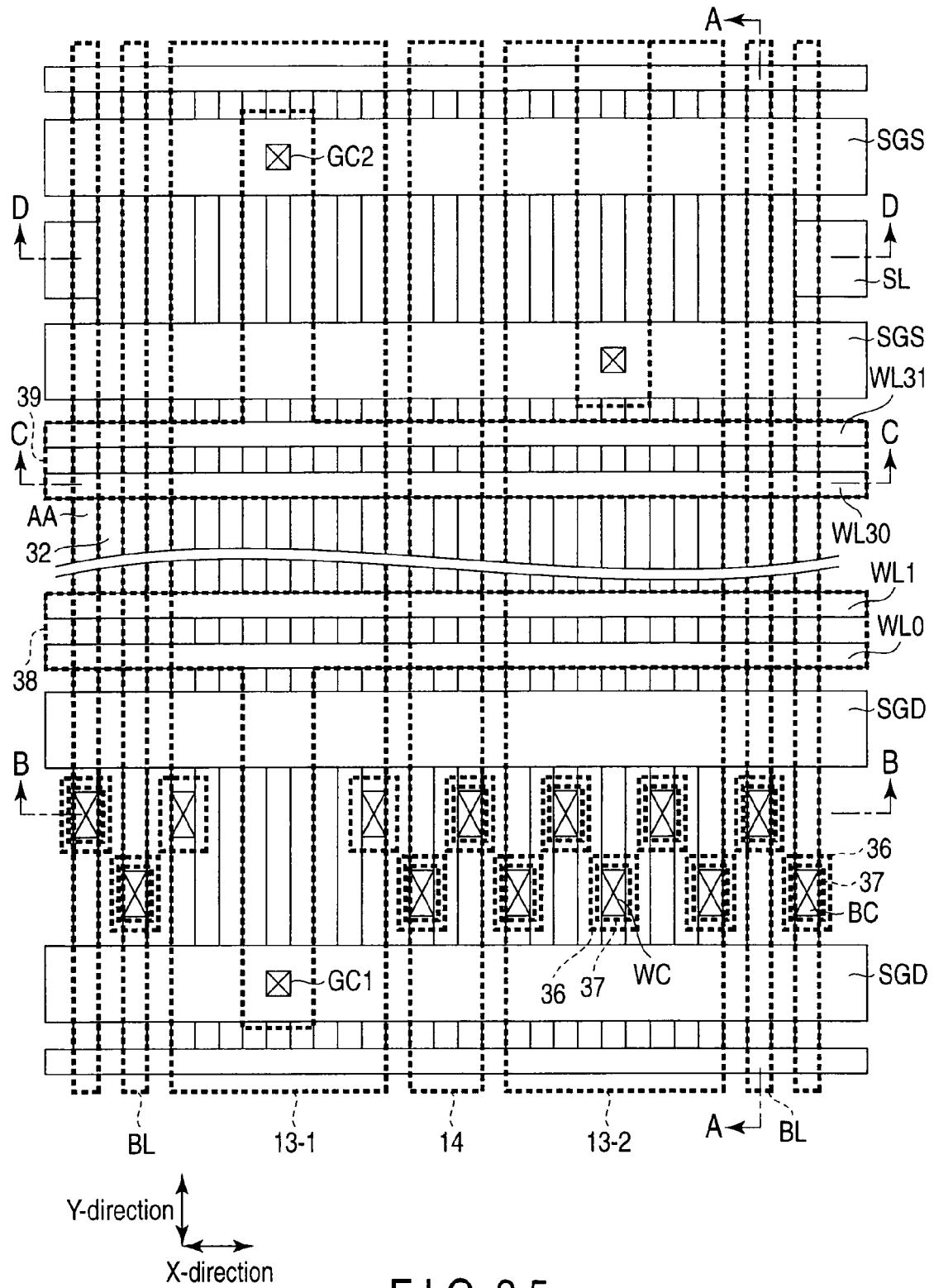
FIG. 35 is a plan view showing the arrangement of a first region of the NAND flash memory.
Figure 36:
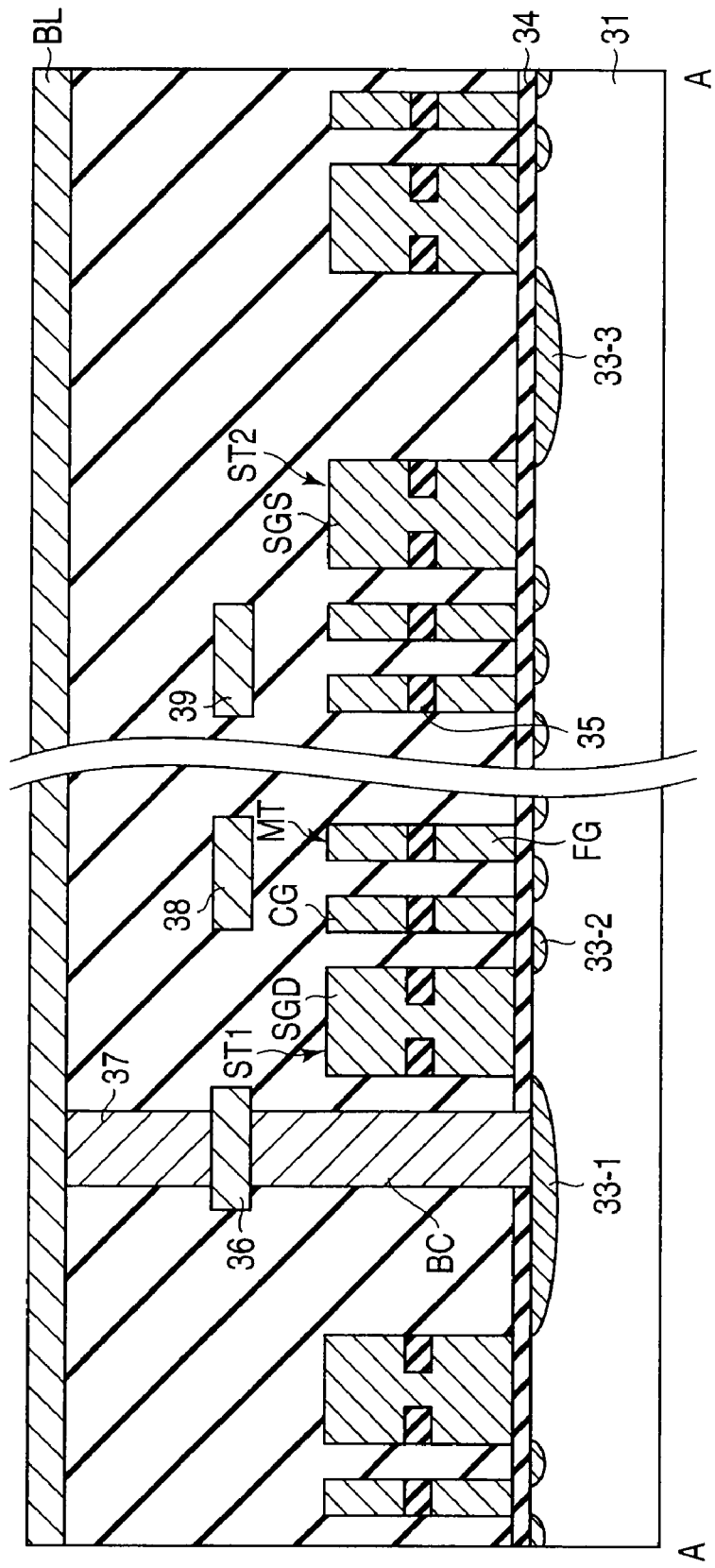
FIG. 36 is a sectional view of the NAND flash memory taken along line A-A in FIG. 35.
Figure 37:
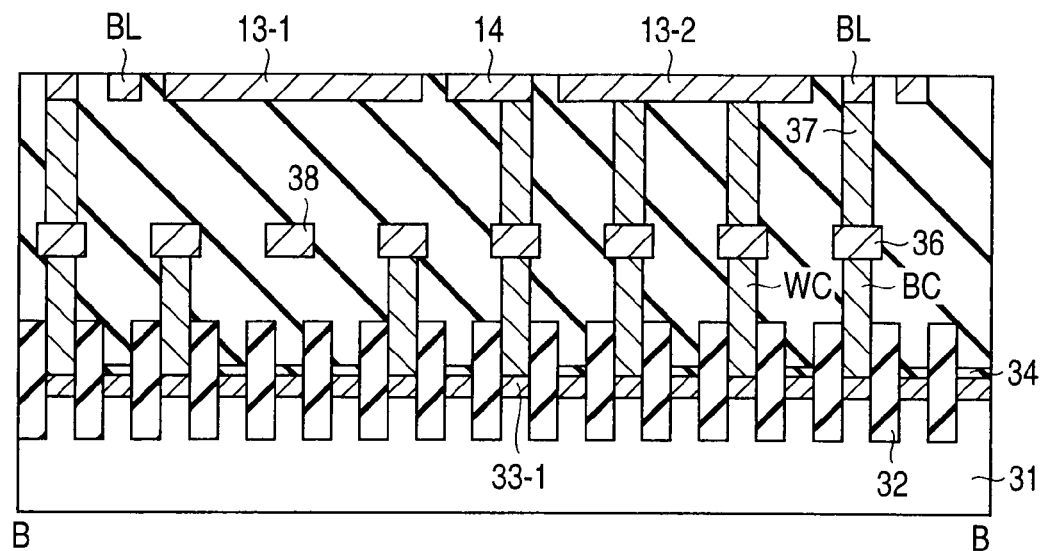
FIG. 37 is a sectional view of the NAND flash memory taken along line B-B in FIG. 35.
Figure 38:
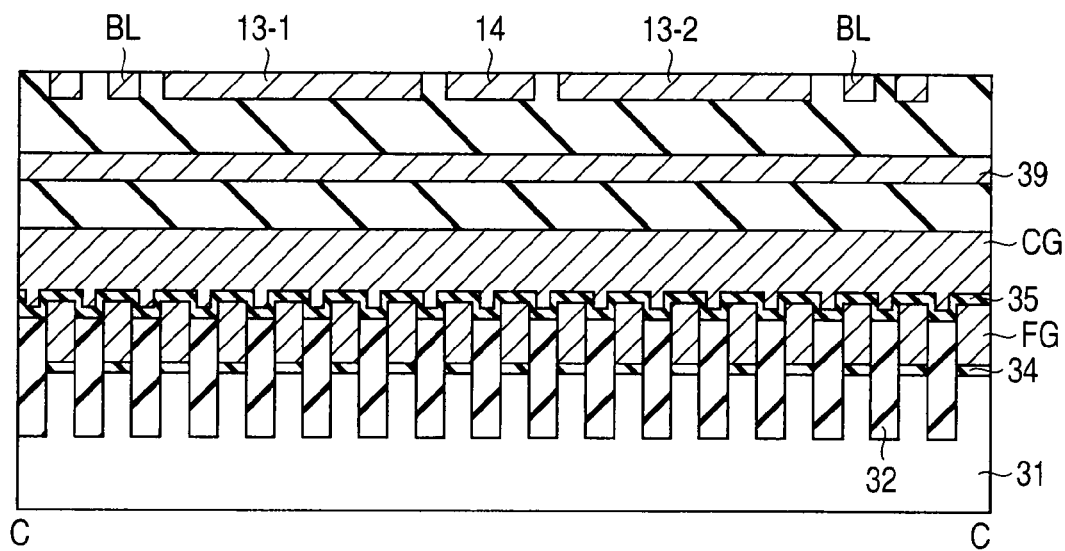
FIG. 38 is a sectional view of the NAND flash memory taken along line C-C in FIG. 35.

FIG. 35 is a plan view showing the arrangement near the first region of the NAND flash memory. Referring to FIG. 35, the first metal interconnection layer M0 and the second metal interconnection layer M1 are indicated by broken lines. FIG. 36 is a sectional view of the NAND flash memory taken along line A-A in FIG. 35. FIG. 37 is a sectional view of the NAND flash memory taken along line B-B in FIG. 35. FIG. 38 is a sectional view of the NAND flash memory taken along line C-C in FIG. 35. FIG. 39 is a sectional view of the NAND flash memory taken along line D-D in FIG. 35.

A plurality of element isolation layers (shallow trench isolation [STI]) 32 running in the Y-direction are provided in a p-type semiconductor substrate 31. Of the surface region of the semiconductor substrate 31, portions without the element isolation layers 32 serve as element areas (active areas [AA]) where semiconductor elements are formed.

As shown in FIG. 36, each memory cell transistor MT is a metal oxide semiconductor field effect transistor (MOSFET) having a stacked gate formed on a gate insulating film 34 on the semiconductor substrate 31. The stacked gate includes a charge accumulation layer (floating gate electrode) FG formed on the gate insulating film 34, and a control gate electrode CG formed on an inter-gate insulating film 35 on the floating gate electrode FG. The control gate electrode CG corresponds to the word line WL. Hence, each control gate electrode CG runs in the X-direction and is shared by the plurality of memory cell transistors MT adjacent in the X-direction.

Select transistor ST1 includes a gate electrode formed on the gate insulating film 34 on the semiconductor substrate 31. The gate electrode corresponds to the select gate line SGD. Each select gate line SGD runs in the X-direction and is shared by the plurality of select transistors ST1 adjacent in the X-direction. Similarly, select transistor ST2 includes a gate electrode formed on the gate insulating film 34 on the semiconductor substrate 31. The gate electrode corresponds to the select gate line SGS. Each select gate line SGS runs in the X-direction and is shared by the plurality of select transistors ST2 adjacent in the X-direction. Select transistor ST1, the 32 memory cell transistors MT, and select transistor ST2 are connected in series in the Y-direction in this order and share an $n^+$-type diffusion region 33-2.

The select gate line SGD is connected to an intermediate interconnection layer 38 via a gate contact GC1. The select gate line SGS is connected to an intermediate interconnection layer 39 via a gate contact GC2. The voltages of the select gate lines SGD and SGS can be set using the intermediate interconnection layers 38 and 39.

A drain region 33-1 of select transistor ST1 is connected to the bit line BL via a bit line contact BC, intermediate interconnection layer 36, and via plug 37. A source region 33-3 of select transistor ST2 is connected to the source line SL. The drain region 33-1 and the source region 33-3 are formed from the $n^+$-type diffusion regions.

As shown in FIG. 37, shunt interconnection 13-2 for a well is connected to the well (semiconductor substrate 31) via the via plug 37, the intermediate interconnection layer 36, and a well contact WC. When the wide shunt interconnection 13-2 is connected to the well, a stable high voltage can be supplied to the well using shunt interconnection 13-2.

Figure 40:
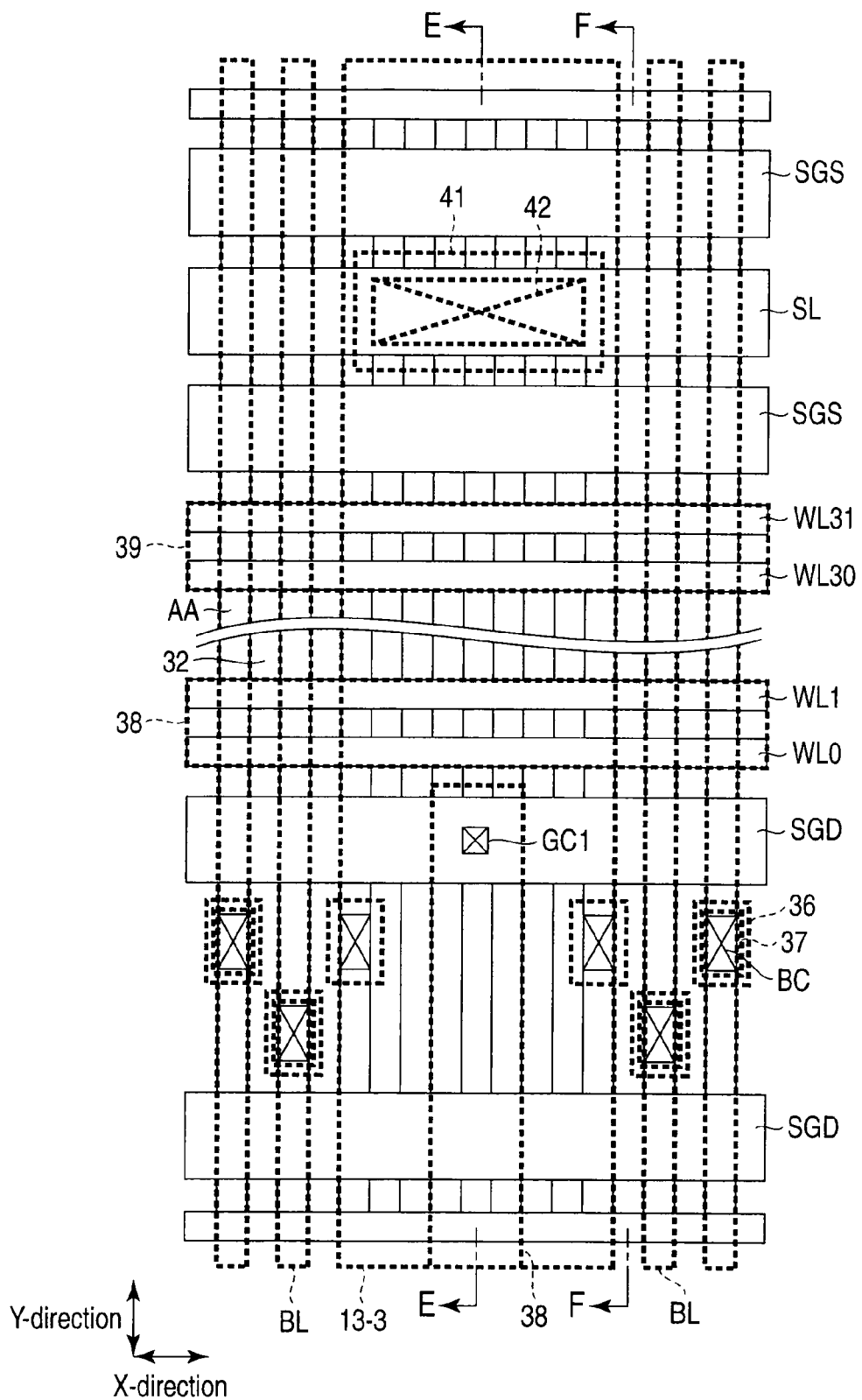
FIG. 40 is a plan view showing the arrangement of a second region of the NAND flash memory.
Figure 42:
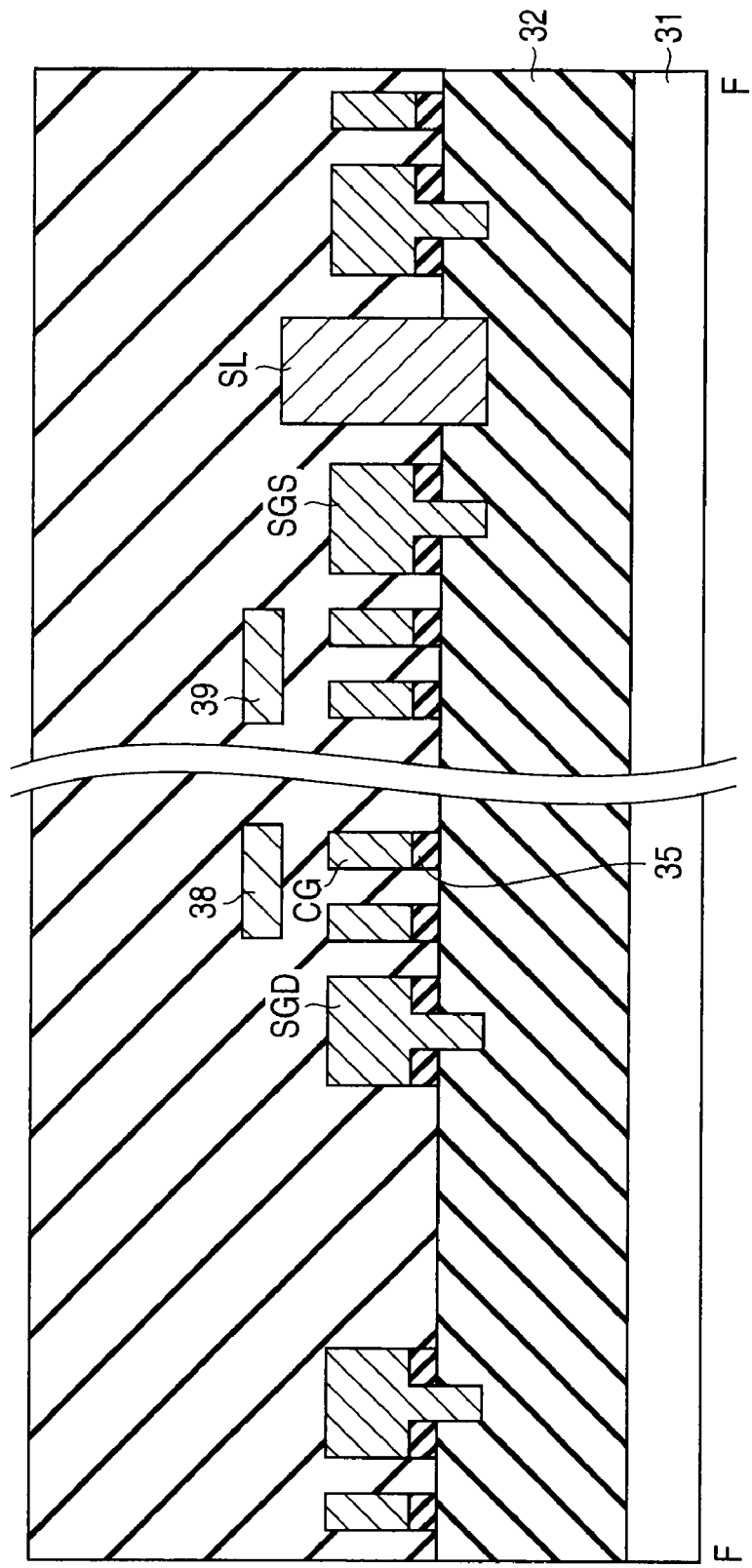
FIG. 42 is a sectional view of the NAND flash memory taken along line F-F in FIG. 40.

FIG. 40 is a plan view showing the arrangement near the second region of the NAND flash memory. Referring to FIG. 40, the first metal interconnection layer M0 and the second metal interconnection layer M1 are indicated by broken lines. FIG. 41 is a sectional view of the NAND flash memory taken along line E-E in FIG. 40. FIG. 42 is a sectional view of the NAND flash memory taken along line F-F in FIG. 40.

As shown in FIG. 41, the source line SL is connected to shunt interconnection 13-3 for a cell source via an intermediate interconnection layer 41 and a via plug 42. When the wide shunt interconnection 13-3 is connected to the source line SL, a stable voltage can be supplied to the source line SL (i.e., the source region 33-3 of select transistor ST2) using shunt interconnection 13-3.

As shown in FIG. 42, the source line SL is led out via shunt interconnection 13-3. This also enables to lead out an interconnection for applying a potential to the gate electrode of the select gate line SGD using the intermediate interconnection layer 38, as shown in FIG. 35.

As described above in detail, according to this embodiment, it is possible to apply the line-and-space patterns of the first and second embodiments to a NAND flash memory. Additionally, the width of the bit line BL can be set to "F" smaller than the minimum feature size "2F". Moreover, since the spaces between the bit lines BL and the shunt interconnections can be set to "F" smaller than the minimum feature size "2F", the NAND flash memory can further be microfabricated.

In the above embodiment, a NAND flash memory has been exemplified. However, the line-and-space patterns of the first and second embodiments are applicable to memories of every types and semiconductor devices other than memories.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor device comprising:
    a plurality of first interconnection layers which are provided in an insulating layer and formed in a pattern having a width and space smaller than a resolution limit of an exposure technique;
    a plurality of second interconnection layers which are provided in the insulating layer and formed in a pattern having a width and space smaller than the resolution limit; and,
    a third interconnection layer which is provided between the first interconnection layers and the second interconnection layers in the insulating layer and has a width larger than that of a first interconnection layer,
    wherein a space between the third interconnection layer and a first interconnection layer adjacent to the third interconnection layer equals the space of the first interconnection layers, and
    a space between the third interconnection layer and a second interconnection layer adjacent to the third interconnection layer equals the space of the first interconnection layers.

2. The device according to claim 1, wherein letting "F" be the width of the first interconnection layer, the width of the third interconnection layer satisfies $$2F \times n - F \text{ (n is a natural number of not less than 1).}$$

3. The device according to claim 1, wherein the space equals the width of the first interconnection layer.

4. The device according to claim 1, wherein the first interconnection layers include shallow interconnections and deep interconnections which are alternately arranged.

5. The device according to claim 1, wherein the first to third interconnection layers are made of one material selected from the group consisting of copper (Cu), aluminum (Al), and ruthenium (Ru).

6. The device according to claim 1, further comprising:
    a cell group having a plurality of memory cells which are connected in series; and
    a first select transistor and a second select transistor which are connected in series with ends of the cell group, respectively,
    wherein each of the first and second interconnection layers is a bit line and is connected to one end of a current path of the first select transistor, and
    the third interconnection layer is a shunt interconnection and is connected to one end of a current path of the second select transistor.

7. A semiconductor device comprising:
    a plurality of first interconnection layers which are provided in an insulating layer and formed in a pattern having a width and space smaller than a resolution limit of an exposure technique;
    two second interconnection layers each of which is provided between the first interconnection layers in the insulating layer and has a width larger than that of a first interconnection layer; and
    a plurality of second interconnection layers which are provided in the insulating layer and formed in a pattern having a width and space smaller than the resolution limit;
    two third interconnection layers which are provided between the first interconnection layers and the second interconnection layers in the insulating layer and have a width larger than that of a first interconnection layer; and
    a fourth interconnection layer which is provided between the third interconnection layers in the insulating layer and has a width not less than that of the first interconnection layer,
    wherein a space between a third interconnection layer and a first interconnection layer adjacent to the third interconnection layer equals the space of the first interconnection layers,
    a space between a third interconnection layer and a second interconnection layer adjacent to the third interconnection layer equals the space of the first interconnection layers, and
    a space between the fourth interconnection layer and each of the third interconnection layers equals the space of the first interconnection layers.

8. The device according to claim 7, wherein letting "F" be the width of the first interconnection layer, the width of the third interconnection layer satisfies $$2F \times n - F \text{ (n is a natural number of not less than 1).}$$

9. The device according to claim 8, wherein letting "F" be the width of the first interconnection layer, the width of the fourth interconnection layer satisfies $$2F \times m - F \text{ (m is a natural number of not less than 1).}$$

10. The device according to claim 7, wherein the space equals the width of the first interconnection layer.

11. The device according to claim 7, wherein the first interconnection layers include shallow interconnections and deep interconnections which are alternately arranged.

12. The device according to claim 7, wherein the first to fourth interconnection layers are made of one material selected from the group consisting of copper (Cu), aluminum (Al), and ruthenium (Ru).

13. The device according to claim 7, further comprising:
a cell group having a plurality of memory cells which are connected in series; and
a first select transistor and a second select transistor which are connected in series with ends of the cell group, respectively,
wherein each of the first and second interconnection layers is a bit line and is connected to one end of a current path of the first select transistor, and
one of the third interconnection layers is a shunt interconnection and is connected to one end of a current path of the second select transistor.

* * * * *